US012796555B2

(12) United States Patent
Kim et al.

(10) Patent No.: US 12,796,555 B2
(45) Date of Patent: Nov. 10, 2026

(54) DISPLAY DEVICE

(71) Applicant: LG Display Co., Ltd., Seoul (KR)

(72) Inventors: JeeHun Kim, Gimpo-si (KR); Hyeran Jeong, Goyang-si (KR); Sungeun Bae, Paju-si (KR); Hyoseob Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 313 days.

(21) Appl. No.: 18/389,107

(22) Filed: Nov. 13, 2023

(65) Prior Publication Data

US 2024/0222341 A1 Jul. 4, 2024

(30) Foreign Application Priority Data

Dec. 29, 2022 (KR) ........................ 10-2022-0189051

(51) Int. Cl.
*H01L 25/16* (2023.01)
*G02F 1/1362* (2006.01)
(Continued)

(52) U.S. Cl.
CPC ...... *H10W 90/00* (2026.01); *G02F 1/136204* (2013.01); *H10D 86/441* (2025.01);
(Continued)

(58) Field of Classification Search
CPC .. H01L 25/167; H01L 25/0753; H10W 90/00; H10W 90/10; H10D 86/441;
(Continued)

(56) References Cited

U.S. PATENT DOCUMENTS

2019/0006335 A1 1/2019 Lee et al.
2020/0152120 A1 5/2020 Li et al.
(Continued)

FOREIGN PATENT DOCUMENTS

KR 10-2017-0080144 A 7/2017
KR 10-2020-0137793 A 12/2020
(Continued)

OTHER PUBLICATIONS

Intellectual Property Office (Great Britain), Combined Search and Examination Report Under Section 17 & 18(3), Application No. GB2316624.2, Apr. 25, 2024, all pages. (Year: 2024).*

*Primary Examiner* — Victoria K. Hall
(74) *Attorney, Agent, or Firm* — Birch, Stewart, Kolasch & Birch, LLP

(57) ABSTRACT

A display apparatus can include a substrate on which a plurality of light emitting diodes is disposed. The display apparatus further includes a plurality of first upper lines disposed on a top surface of the substrate. The display apparatus further includes a plurality of first lower lines disposed on a rear surface of the substrate. The display apparatus further includes a plurality of first side lines disposed on a side surface of the substrate and electrically connected to the plurality of first upper lines and the plurality of first lower lines. The display apparatus further includes a first shorting bar disposed on the side surface of the substrate and electrically connecting at least some of the plurality of first side lines.

22 Claims, 22 Drawing Sheets

(51) Int. Cl.

| | |
|---|---|
| ***H01L 27/12*** | (2006.01) |
| ***H10D 86/40*** | (2025.01) |
| ***H10D 86/60*** | (2025.01) |
| ***H10H 20/857*** | (2025.01) |
| ***H10K 59/131*** | (2023.01) |
| ***H10W 90/00*** | (2026.01) |

(52) U.S. Cl.
CPC ........... *H10D 86/443* (2025.01); *H10D 86/60* (2025.01); *H10H 20/857* (2025.01); *H10K 59/1315* (2023.02); *G09G 2300/026* (2013.01); *G09G 2300/0426* (2013.01)

(58) Field of Classification Search
CPC ................. H05K 1/117; H05K 1/0265; H05K 2201/10136; H05K 2201/094; H05K 2201/09727; H10H 29/857; H10H 20/857; G09F 9/3026; G09F 9/33
See application file for complete search history.

(56) References Cited

U.S. PATENT DOCUMENTS

| | | | | |
|---|---|---|---|---|
| 2021/0202685 | A1* | 7/2021 | Ban | H10K 59/18 |
| 2022/0085099 | A1 | 3/2022 | Son et al. | |
| 2022/0199952 | A1 | 6/2022 | Jang et al. | |
| 2023/0237937 | A1* | 7/2023 | Choi | H01L 25/167<br>257/79 |
| 2023/0238394 | A1* | 7/2023 | Lee | H10D 86/441 |

FOREIGN PATENT DOCUMENTS

| | | | | |
|---|---|---|---|---|
| KR | 10-2020-0145809 | A | 12/2020 | |
| WO | WO2020/166986 | A1 * | 8/2020 | H01L 27/12 |

* cited by examiner

DISPLAY DEVICE

CROSS-REFERENCE TO RELATED APPLICATIONS

This application claims priority to Korean Patent Application No. 10-2022-0189051 filed on Dec. 29, 2022, in the Republic of Korea, the entire contents of which are hereby expressly incorporated by reference into the present application.

BACKGROUND

Field

The present disclosure relates to a display device, and more particularly, to a display device using a light emitting diode (LED) with improves heat generation.

Discussion of the Related Art

An application range of liquid crystal display devices (LCDs) and organic light emitting display devices (OLEDs) has gradually expanded.

The LCDs and the OLEDs are widely applied to the screen of various electronic devices such as mobile phones and laptop computers because they can provide a high resolution image and can be made thin and light. Further, the application range thereof has been gradually expanded.

However, the LCDs and the OLEDs can have a limitation in reducing the size of a bezel area which is visibly recognized by a user as an area in which an image is not displayed. Further, it can be challenging to implement an ultra-large screen with a single panel.

Therefore, when the ultra-large screen is implemented by disposing a plurality of liquid crystal display panels or a plurality of organic light emitting display panels in the form of tiles, bezel areas between adjacent panels may be visibly recognized by a user.

SUMMARY OF THE DISCLOSURE

An object to be achieved by the present disclosure is to provide a display device that implements a zero-bezel.

Another object to be achieved by the present disclosure is to provide a display device which reduces a line resistance and thus results in an improvement in heat generation.

Objects of the present disclosure are not limited to the above-mentioned objects, and other objects, which are not mentioned above, can be clearly understood by those skilled in the art from the following descriptions.

According to an aspect of the present disclosure, the display device includes a substrate on which a plurality of light emitting diodes is disposed. Further, the display device includes a plurality of first upper lines disposed at one side on a top surface of the substrate and a plurality of first lower lines disposed at one side on a rear surface of the substrate. Further, the display device includes a plurality of first side lines disposed at one side on a side surface of the substrate and electrically connected to the plurality of first upper lines and the plurality of first lower lines. Furthermore, the display device includes a first shorting bar disposed at one side on the side surface of the substrate and electrically connecting at least some of the plurality of first side lines.

Other detailed matters of the exemplary embodiments are included in the detailed description and the drawings.

According to the present disclosure, a shorting bar is disposed for a power line on a side surface of a substrate. Therefore, it is possible to implement a zero-bezel.

According to the present disclosure, the shorting bar is disposed without a spatial limit of an active area. Therefore, it is possible to sufficiently reduce a line resistance and improve heat generation.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
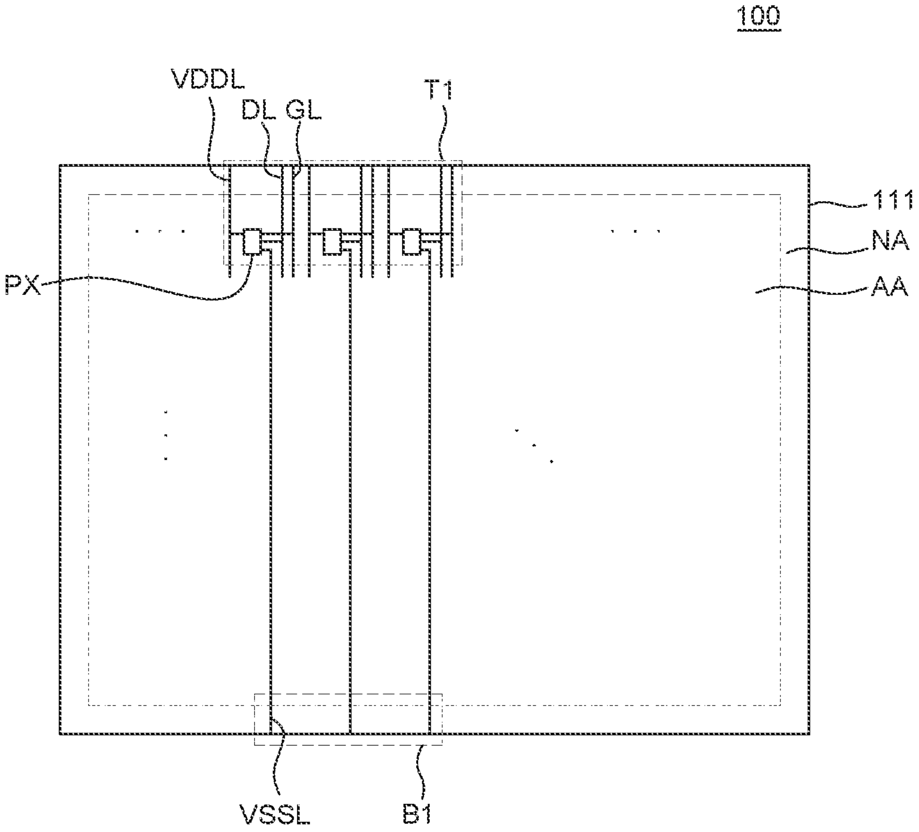
FIG. 1 is a schematic top view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other. Further, all the components of each display device according to all embodiments of the present disclosure are operatively coupled and configured.

Figure 2:
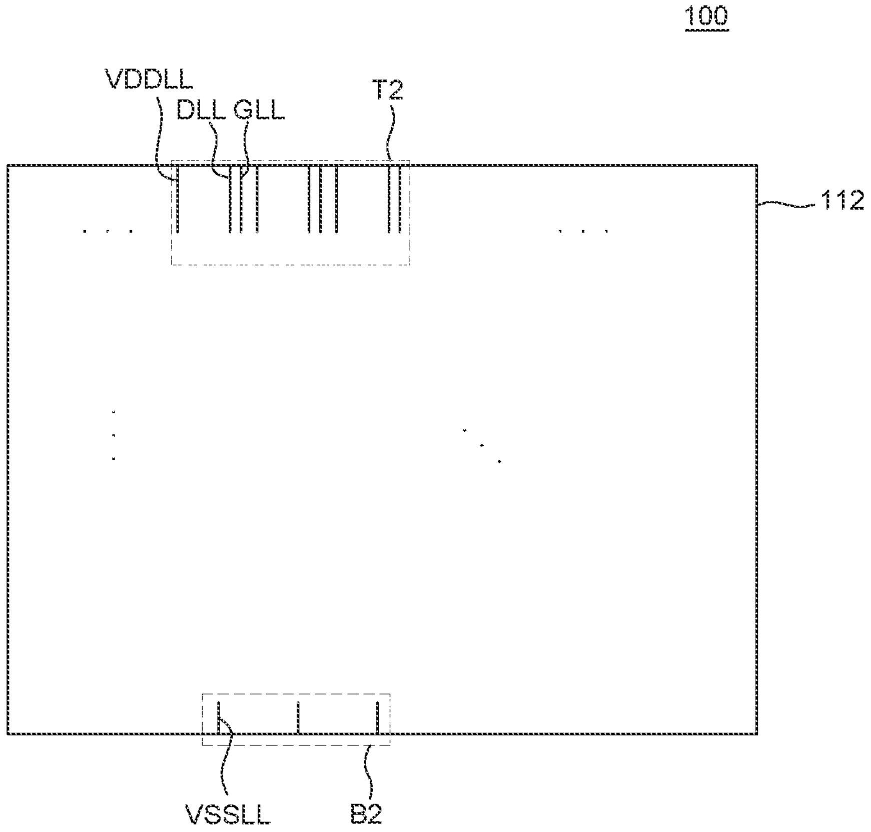
FIG. 2 is a schematic rear view of the display device according to an exemplary embodiment of the present disclosure.

FIG. 1 is a schematic top view of a display device according to an exemplary embodiment of the present disclosure. FIG. 2 is a schematic rear view of the display device according to an exemplary embodiment of the present disclosure.

Referring to FIGS. 1 and 2, a display device 100 according to an exemplary embodiment of the present disclosure includes a substrate on which a plurality of light emitting diodes is disposed. Further, the display device 100 includes a plurality of first upper lines disposed at one side on a top surface of the substrate and a plurality of first lower lines disposed on a rear surface of the substrate. Further, the display device 100 includes a plurality of second upper lines disposed at the other side (or another side) on a top surface of the substrate and a plurality of second lower lines disposed on a rear surface on the other side of the substrate.

The display device 100 according to an exemplary embodiment of the present disclosure includes the plurality of first upper lines and the plurality of first lower lines disposed on a top side of the substrate. Further, the display device 100 includes the plurality of second upper lines and the plurality of second lower lines disposed on a bottom side of the substrate.

The display device 100 includes the substrate formed by bonding a first sub-substrate 111 and a second sub-substrate 112. Herein, the top surface of the substrate can refer to a top surface of the first sub-substrate 111, and the rear surface of the substrate can refer to a rear surface of the second sub-substrate 112.

Referring to FIG. 1, the first sub-substrate 111 serves to support components disposed on the first sub-substrate 111, and can be an insulating substrate. The first sub-substrate 111 can be made of glass or a resin. Further, the first sub-substrate 111 can include a polymer or plastic. The first sub-substrate 111 can also be made of a plastic material having flexibility.

An active area AA and a non-active area NA that encloses (or positioned adjacent to) the active area AA can be defined in the first sub-substrate 111. The active area AA is an area where an image is actually displayed on the display device 100. In the active area AA, an LED and a transistor for driving the LED to be described layer can be disposed. The non-active area NA is an area where an image is not displayed, and can be defined as an area enclosing the active area AA. In the non-active area NA, various lines such as a gate line GL and a data line DL connected to the LED and the transistor disposed in the active area AA can be disposed.

In the present disclosure, the first sub-substrate 111 is defined as including the active area AA and the non-active area NA. However, the present disclosure is not limited thereto. The first sub-substrate 111 can be defined as not including the non-active area NA. For example, when a tiling display device is implemented by using the display device 100, the distance between an outermost LED of a panel and an outermost LED of an adjacent panel can be equal to the distance between LEDs in the panel. Thus, it is possible to implement a zero-bezel where substantially no bezel is formed. Therefore, the first sub-substrate 111 can be defined as including the active area AA only, and the non-active area NA may not be defined in the first sub-substrate 111. Accordingly, the non-active area NA can also be defined as an outer peripheral portion.

A plurality of pixels PX is disposed in the active area AA of the first sub-substrate 111. Each of the pixels PX is a unit for emitting light. The plurality of pixels PX can include a red sub-pixel PX, a green sub-pixel PX, and a blue sub-pixel PX, but is not limited to. Each of the plurality of pixels PX can include a transistor and an LED as a light emitting element. The transistor and the LED will be described later in more detail with reference to FIG. 7.

The plurality of first upper lines including a plurality of data lines DL, a plurality of gate lines GL, and a plurality of high potential voltage lines VDDL is disposed on the first sub-substrate 111. Further, the plurality of second upper lines including a plurality of low potential voltage lines VSSL is disposed on the first sub-substrate 111.

The plurality of data lines DL serves to transmit a data signal to the plurality of pixels PX, respectively. The plurality of high potential voltage lines VDDL serves to apply a high potential voltage to the plurality of pixels PX. The plurality of low potential voltage lines VSSL serves to apply a low potential voltage to the plurality of pixels PX. The plurality of gate lines GL serves to transmit a gate signal to the plurality of pixels PX, respectively. However, if a gate driver is disposed in the active area AA, the plurality of gate lines GL can serve as gate link lines.

The plurality of data lines DL, the plurality of gate lines GL, and the plurality of high potential voltage lines VDDL can be disposed on one side of the first sub-substrate 111. They can extend in the same first direction (for example, a direction toward the center of the first sub-substrate 111) so as to be connected to each of the plurality of pixels PX. Further, the plurality of low potential voltage lines VSSL can be disposed on the other side of the first sub-substrate 111. They can extend in a second direction parallel to the first direction so as to be connected to the plurality of pixels PX, respectively.

Referring to FIG. 2, the second sub-substrate 112 serves to support components disposed under the second sub-substrate 112, and can be an insulating substrate. For example, the second sub-substrate 112 can be made of glass or a resin. Further, the second sub-substrate 112 can include a polymer or plastic. The second sub-substrate 112 can be made of the same material as the first sub-substrate 111. In some exemplary embodiments, the second sub-substrate 112 can also be made of a plastic material having flexibility.

The first lower lines including a plurality of high potential voltage link lines VDDLL, a plurality of data link lines DLL, and a plurality of gate link lines GLL are disposed on the rear surface of the second sub-substrate 112. Further, the second lower lines including a plurality of low potential voltage link lines VSSLL are disposed on the rear surface of the second sub-substrate 112.

The plurality of high potential voltage link lines VDDLL serves to connect the plurality of high potential voltage lines VDDL disposed on the top surface of the first sub-substrate 111 to a flexible film. The plurality of data link lines DLL serves to connect the plurality of data lines DL disposed on the first sub-substrate 111 to the flexible film. The plurality of low potential voltage link lines VSSLL serves to connect the plurality of low potential voltage lines VSSL disposed on the top surface of the first sub-substrate 111 to the flexible film. The plurality of gate link lines GLL serves to connect the plurality of gate lines GL disposed on the top surface of the first sub-substrate 111 to the gate driver. However, if the gate driver is disposed in the active area AA, the plurality of gate link lines GLL can be defined as connecting the flexible film to the plurality of gate lines GL. The plurality of gate link lines GLL, the plurality of data link lines DLL, and the plurality of high potential voltage link lines VDDLL can be disposed on one side of the second sub-substrate 112. They can extend in the first direction (for example, a direction toward the center of the substrate) of the second sub-substrate 112. The plurality of low potential voltage link lines VSSLL can be disposed on the other side of the second sub-substrate 112, and can extend in the second direction parallel to the first direction the second sub-substrate 112.

The gate driver can be disposed under the second sub-substrate 112 so as to be electrically connected to the plurality of gate link lines GLL. The gate driver can be formed directly under the second sub-substrate 112, or can be disposed under the second sub-substrate 112 in a chip-on-film (COF) manner, but is not limited thereto. Further, the gate driver can be formed in a gate-in-panel (GIP) manner, or can be formed on the first sub-substrate 111 in a gate-in-active area (GIA) manner. Further, the flexible film can be disposed under the second sub-substrate 112 so as to be electrically connected to the plurality of data link lines DLL, the plurality of high potential voltage link lines VDDLL, and the plurality of low potential voltage link lines VSSLL.

FIG. 1 and FIG. 2 illustrate that two substrates, i.e., the first sub-substrate 111 and the second sub-substrate 112, are used for the display device 100. However, a single substrate can also be used for the display device 100. For example, the first sub-substrate 111 and the second sub-substrate 112 can form the same single substrate. Various lines disposed on the first sub-substrate 111 can be disposed on the single substrate, and various link lines disposed under the second sub-substrate 112 can be disposed under the single substrate.

Further, FIG. 1 and FIG. 2 illustrate that the high potential voltage line VDDL, and the data lines DL and the gate lines GL that serve as driving lines are disposed as the first upper lines at one side on the top surface of the first sub-substrate 111. However, the driving lines according to exemplary embodiments of the present disclosure can further include a plurality of reference voltage lines and a plurality of emission signal lines. The plurality of reference voltage lines and the plurality of emission signal lines are connected to the pixels PX and supply a reference voltage and an emission signal required for driving the pixels PX. Herein, lower lines respectively corresponding to the plurality of reference voltage lines and the plurality of emission signal lines can be disposed at one side on the rear surface of the second sub-substrate 112. Further, a plurality of side lines connecting the plurality of reference voltage lines and the plurality of emission signal lines to the corresponding lower lines can be disposed on side surfaces of the first sub-substrate 111 and the second sub-substrate 112.

Figure 3:
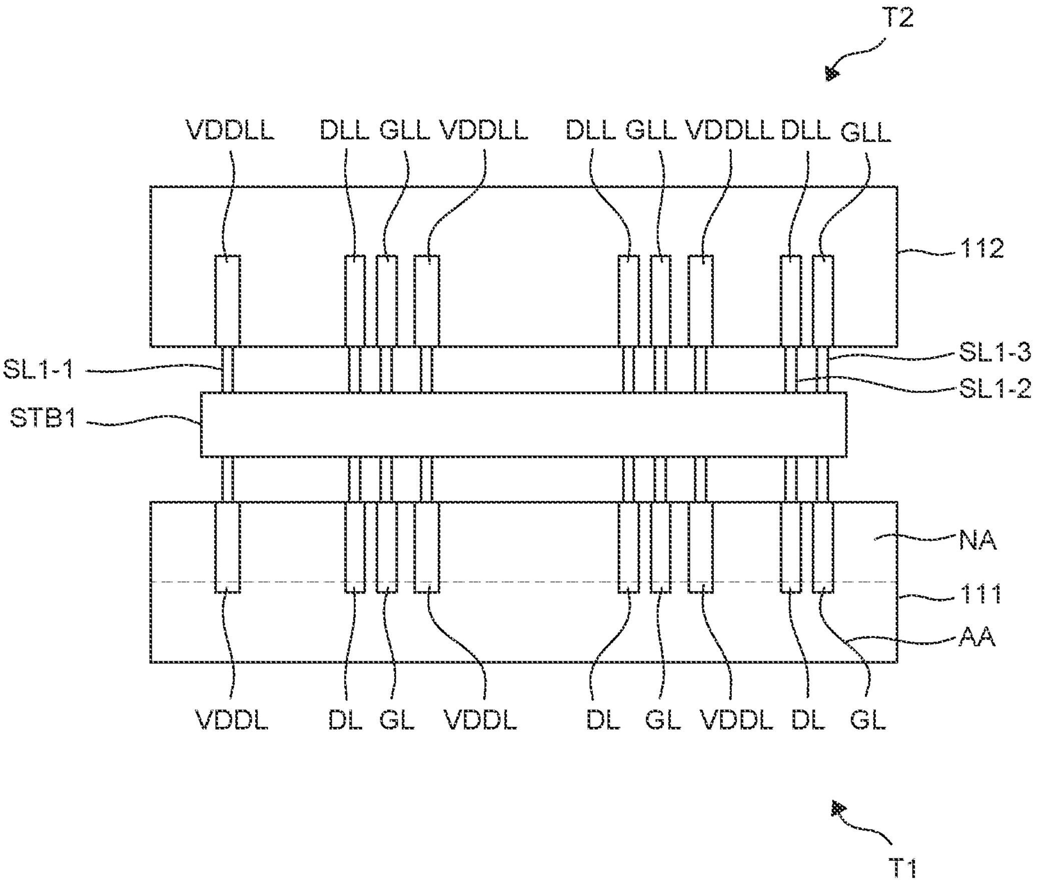
FIG. 3 is a plan view schematically illustrating the layout of lines in a portion T1 of FIG. 1 and a portion T2 of FIG. 2.

FIG. 3 is a plan view schematically illustrating the layout of lines in a portion T1 of FIG. 1 and a portion T2 of FIG. 2. FIG. 3 illustrates the portion T1 of FIG. 1 on the lower side, the portion T2 of FIG. 2 on the upper side, and a side surface of the substrate between the portions T1 and T2.

The display device 100 according to an exemplary embodiment of the present disclosure includes the upper lines disposed on the top surface of the substrate and the lower lines disposed on the rear surface of the substrate described above with reference to FIG. 1 and FIG. 2. Further, the display device 100 includes a plurality of side lines disposed on the side surface of the substrate and connecting the upper lines to the lower lines, respectively. Further, the display device 100 includes a shorting bar connecting at least some of the plurality of side lines.

Referring to FIG. 3, the display device 100 includes a plurality of first side lines disposed at one side on a side surface of the first sub-substrate 111 and the second sub-substrate 112. The plurality of first side lines connects the plurality of first upper lines and the plurality of first lower lines. The plurality of first side lines includes a plurality of first-first side lines SL1-1, a plurality of first-second side lines SL1-2, and a plurality of first-third side lines SL1-3. Further, the display device 100 includes a first shorting bar STB1 (e.g., electrically shorting/connecting) electrically connecting the plurality of first-first side lines SL1-1.

The first-first side line SL1-1 connects the high potential voltage line VDDL disposed at one side on the top surface of the first sub-substrate 111 to the high potential voltage link line VDDLL disposed at one side on the rear surface of the second sub-substrate 112.

The first-second side line SL1-2 connects the data line DL disposed at one side on the top surface of the first sub-substrate 111 to the data link line DLL disposed at one side on the rear surface of the second sub-substrate 112.

The first-third side line SL1-3 connects the gate line GL disposed at one side on the top surface of the first sub-substrate 111 to the gate link line GLL disposed at one side on the rear surface of the second sub-substrate 112.

The first shorting bar STB1 electrically connects the plurality of first-first side lines SL1-1.

As described above, the first shorting bar STB1 is disposed to electrically connect the side lines SL1-1 respectively connected to the plurality of high potential voltage lines VDDL. Thus, it is possible to reduce a line resistance caused by the high potential voltage line VDDL to which a constant voltage is applied. Further, the first shorting bar STB1 is disposed on the side surface of the substrate. Thus, the width of the first shorting bar STB1 can be set more freely on the side surface than on the spatially limited top surface or rear surface of the substrate. Therefore, it is possible to more effectively reduce the line resistance. Accordingly, it is also possible to improve a heat generation defect. Further, since the first shorting bar STB1 is disposed on the side surface of the substrate, it is possible to implement a zero-bezel compared to a case where a shorting bar is disposed on the top surface of the substrate.

Hereinafter, the layout of lines disposed on one side of the substrate among the plurality of lines of the display device 100 illustrated in FIG. 3 will be described in detail with reference to FIG. 4A through FIG. 4F.

Figure 4A:
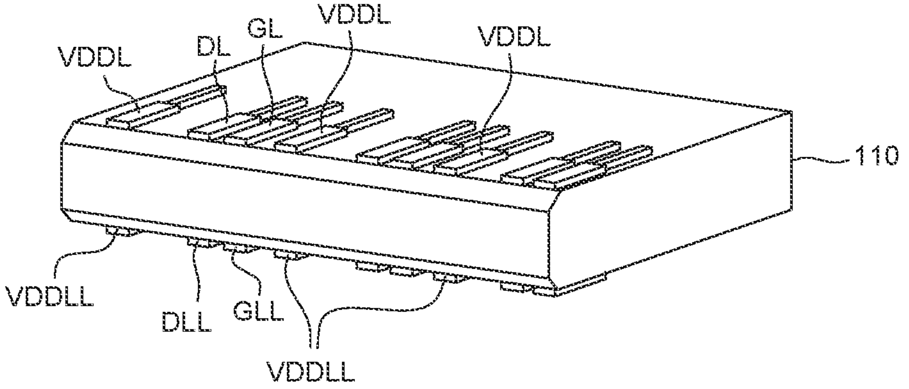
FIG. 4A is a perspective view schematically illustrating the layout of lines in the portion T1 of FIG. 1 and the portion T2 of FIG. 2.
Figure 4B:
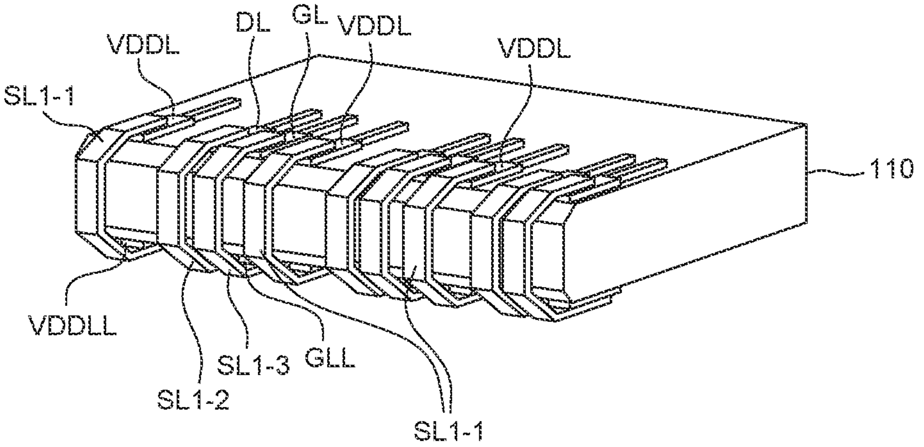
FIG. 4B is a perspective view illustrating a structure in which side lines are connected to the lines of FIG. 4A.
Figure 4C:
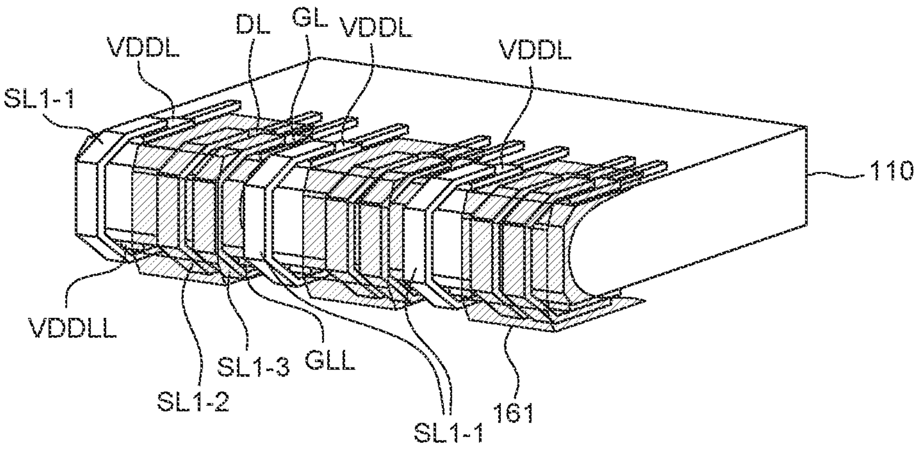
FIG. 4C is a perspective view illustrating a structure in which an insulating layer is disposed on some of the side lines of FIG. 4B.
Figure 4D:
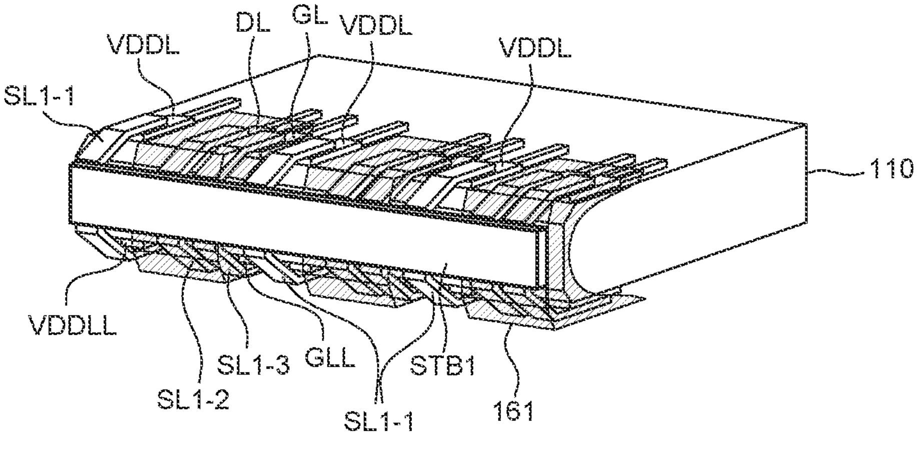
FIG. 4D is a perspective view illustrating a structure in which a shorting bar is disposed on the insulating layer of FIG. 4C.
Figure 4E:
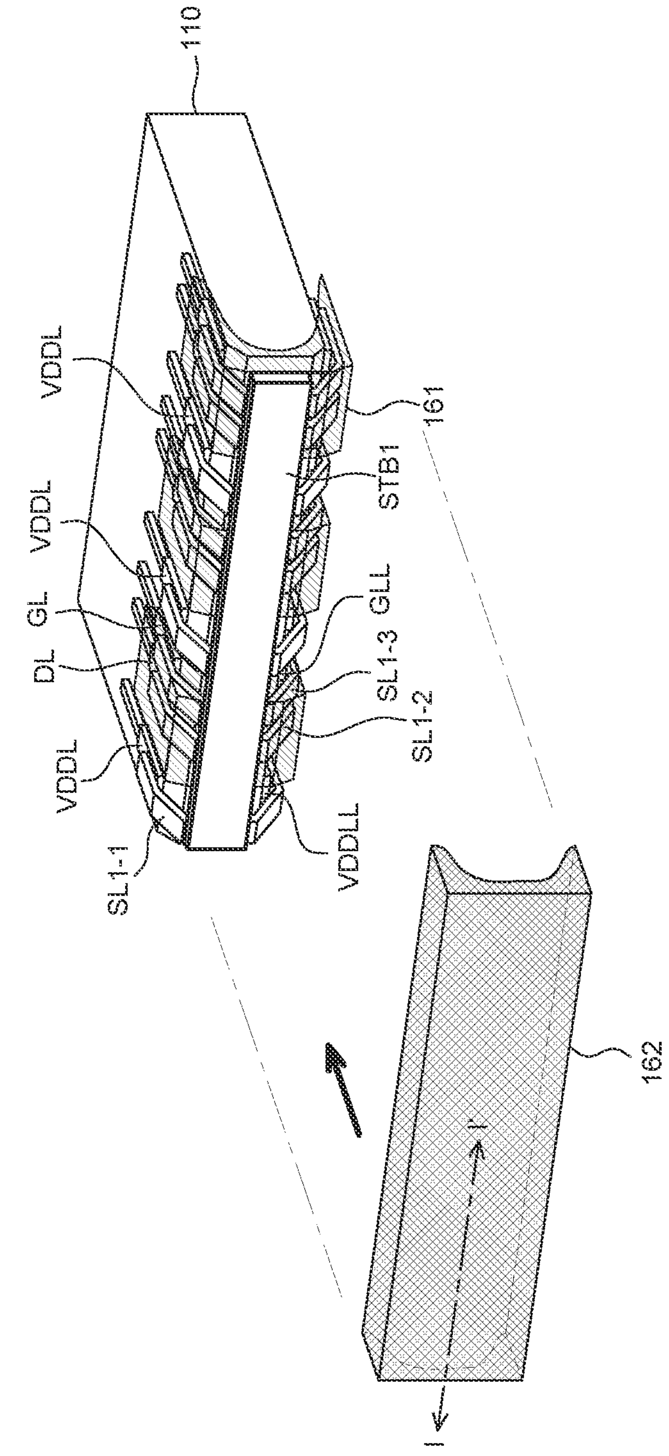
FIG. 4E is a perspective view illustrating a structure in which a black insulating layer covers the shorting bar of FIG. 4D.
Figure 4F:
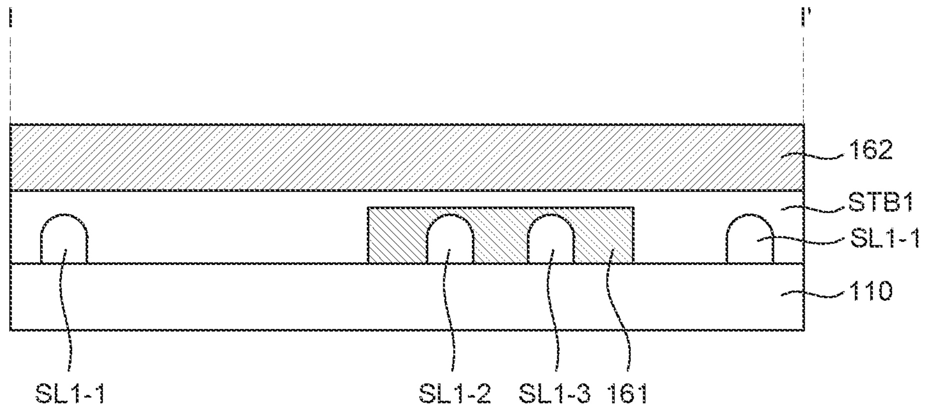
FIG. 4F is a schematic cross-sectional view as taken along a line I-I' of FIG. 4E.

FIG. 4A is a perspective view schematically illustrating the layout of lines in the portion T1 of FIG. 1 and the portion T2 of FIG. 2. FIG. 4B is a perspective view illustrating a structure in which side lines are connected to the lines of FIG. 4A. FIG. 4C is a perspective view illustrating a structure in which an insulating layer is disposed on some of the side lines of FIG. 4B. FIG. 4D is a perspective view illustrating a structure in which a shorting bar is disposed on the insulating layer of FIG. 4C. FIG. 4E is a perspective view illustrating a structure in which a black insulating layer covers the shorting bar of FIG. 4D. FIG. 4F is a schematic cross-sectional view as taken along a line I-I' of FIG. 4E. For the convenience of description, FIG. 4A through FIG. 4F illustrate the first sub-substrate 111 and the second sub-substrate 112 bonded to the first sub-substrate 111 as a single substrate 110.

Referring to FIG. 4A and FIG. 4B, the high potential voltage line VDDL, the data line DL, and the gate line GL as the first upper lines are disposed at one side on a top surface of the substrate 110. Further, the high potential voltage link line VDDLL, the data link line DLL, and the gate link line GLL as the first lower lines are disposed on a rear surface on one side of the substrate 110 so as to correspond in position to the first upper lines, respectively. Further, the first-first side line SL1-1, the first-second side line SL1-2, and the first-third side line SL1-3 as the first side lines are disposed at one side on a side surface of the substrate 110 so as to correspond in position to the first upper lines and the first lower lines, respectively.

In the exemplary embodiments of the present disclosure, the plurality of side lines can be formed through a pad printing process using a pad to print a metal material such as silver (Ag). However, the present disclosure is not limited thereto. Further, as shown in FIG. 4B, parts of end portions of the side lines SL1-1, SL1-2 and SL1-3 can be formed to overlap end portions of the upper lines on the top surface of the substrate 110. Further, the parts of the end portions of the side lines SL1-1, SL1-2 and SL1-3 can be formed to overlap end portions of the lower lines on the rear surface of the substrate 110.

Referring to FIG. 4C and FIG. 4D, a first insulating layer 161 is disposed to cover the first-second side line SL1-2 and the first-third side line SL1-3 disposed at one side on the side surface of the substrate 110. Further, the first shorting bar STB1 is disposed on the first-first side line SL1-1 and the first insulating layer 161. Thus, the first shorting bar STB1 electrically connects the plurality of first-first side lines SL1-1 that connects the plurality of high potential voltage lines VDDL to the plurality of high potential voltage link lines VDDLL. Further, the first shorting bar STB1 is insulated from the first-second side line SL1-2 and the first-third side line SL1-3 that connect the other upper lines and lower lines. As such, the first shorting bar STB1 is electrically connected to only the first-first side lines SL1-1, and is not electrically connected to the first-second side lines SL1-2 and the first-third side lines SL1-3.

In the exemplary embodiments of the present disclosure, the shorting bar can be formed through a pad printing process using a pad to print the same material (e.g., a metal material such as silver (Ag)) as the side lines. However, the present disclosure is not limited thereto.

Referring to FIG. 4E, a second insulating layer 162 is disposed to cover the first shorting bar STB1 and the first insulating layer 161, and all of the exposed parts of the plurality of first-first side lines SL1-1 disposed at one side on the side surface of the substrate 110.

If the plurality of first side lines SL1-1, SL1-2 and SL1-3, and the first shorting bar STB1 are made of a metal material, external light or light from the light emitting diode can be reflected and then visually recognized by the user. Therefore, the second insulating layer 162 can be made of a black material or can include a black material. Accordingly, it is possible to suppress a light leakage between adjacent display devices 100 according to an exemplary embodiment of the present disclosure when an ultra-large screen is implemented by disposing the display devices 100 in the form of tiles.

FIG. 4F is a cross-sectional view as taken along the line I-I' of FIG. 4E. Herein, the second insulating layer 162 is coupled to cover the first shorting bar STB1 extending in a direction along the line I-I', the first insulating layer 161, and all of the exposed parts of the plurality of first-first side lines SL1-1.

As shown in FIG. 4F, the first-first side line SL1-1, the first-second side line SL1-2, and the first-third side line SL1-3 are repeatedly disposed on the substrate 110. Further, the first insulating layer 161 is disposed to cover the first-second side line SL1-2 and the first-third side line SL1-3. Further, the first shorting bar STB1 is disposed on the first insulating layer 161 and the first-first side line SL1-1, and the second insulating layer 162 is disposed on the first shorting bar STB1.

Figure 5:
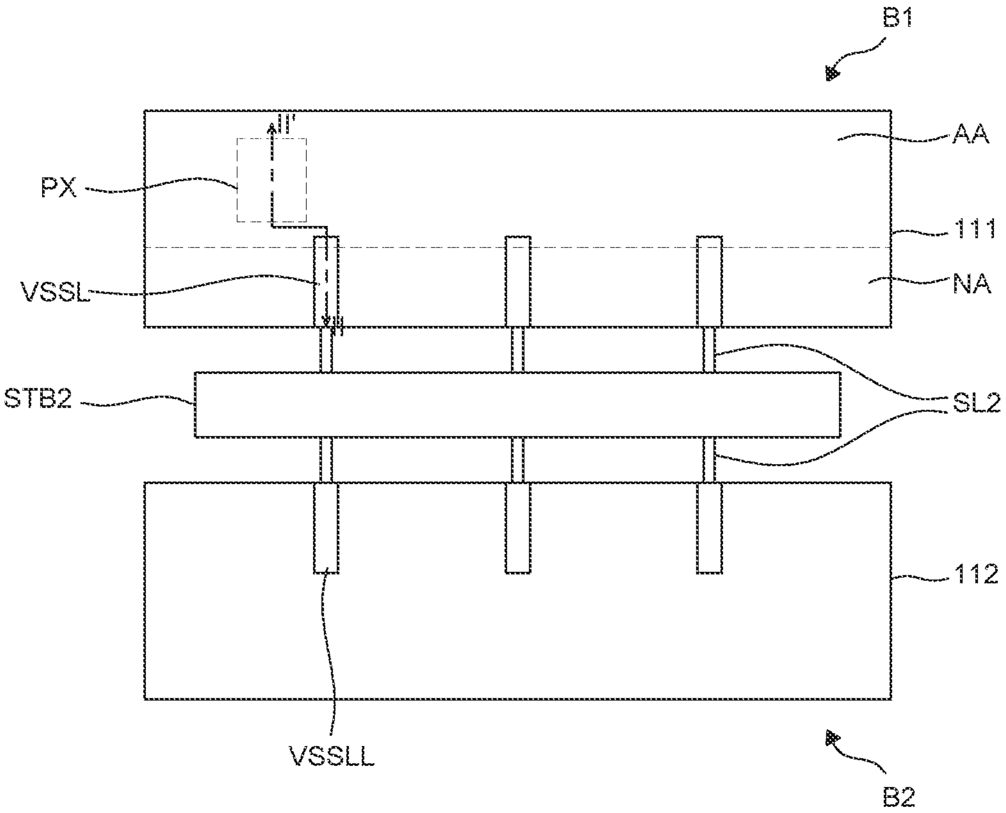
FIG. 5 is a plan view schematically illustrating the layout of lines in a portion B1 of FIG. 1 and a portion B2 of FIG. 2.

FIG. 5 is a plan view schematically illustrating the layout of lines in a portion B1 of FIG. 1 and a portion B2 of FIG. 2. FIG. 5 illustrates the portion B1 of FIG. 1 on the lower side, the portion B2 of FIG. 2 on the upper side, and the side surface of the substrate between the portions B1 and B2.

Referring to FIG. 5, the display device 100 includes a plurality of second side lines SL2. The plurality of second side lines SL2 is disposed at the other side on side surfaces of the first sub-substrate 111 and the second sub-substrate 112 and connects the plurality of second upper lines to the plurality of second lower lines. Further, the display device 100 includes a second shorting bar STB2 electrically connecting the plurality of second side lines SL2.

The second side line SL2 connects the low potential voltage line VSSL disposed at the other side on a top surface of the first sub-substrate 111 and the low potential voltage link line VSSLL disposed at the other side on a rear surface of the second sub-substrate 112.

The second shorting bar STB2 electrically connects the plurality of second side lines SL2.

As described above, the second shorting bar STB2 is disposed to electrically connect the side lines SL2 respectively connected to the plurality of low potential voltage lines VSSL. Thus, it is possible to reduce a line resistance caused by the low potential voltage line VSSL to which a constant voltage is applied. Further, the second shorting bar STB2 is disposed on the side surface of the substrate. Thus, the width of the second shorting bar STB2 can be set more freely on the side surface than on the spatially limited top surface or rear surface of the substrate. Therefore, it is possible to more effectively reduce the line resistance. Accordingly, it is also possible to improve a heat generation defect. Further, since the second shorting bar STB2 is disposed on the side surface of the substrate, it is possible to implement a zero-bezel compared to a case where a shorting bar is disposed on the top surface of the substrate.

Hereinafter, the layout of lines disposed on the other side of the substrate among the plurality of lines of the display device 100 illustrated in FIG. 5 will be described in detail with reference to FIG. 6A through FIG. 6E.

Figure 6A:
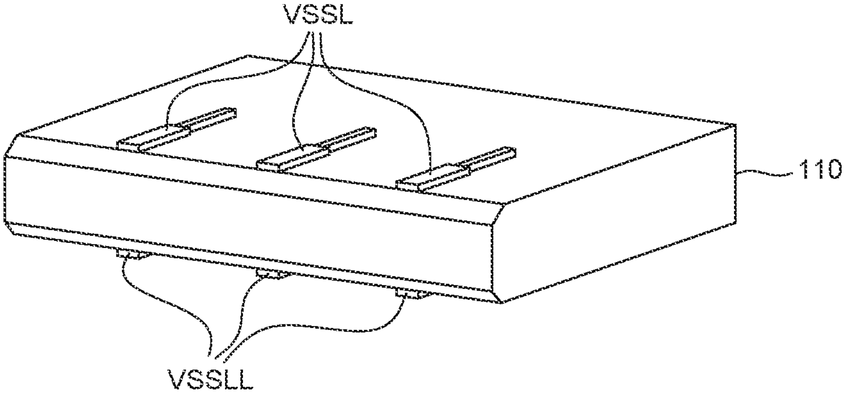
FIG. 6A is a perspective view schematically illustrating the layout of lines in the portion B1 of FIG. 1 and the portion B2 of FIG. 2.
Figure 6B:
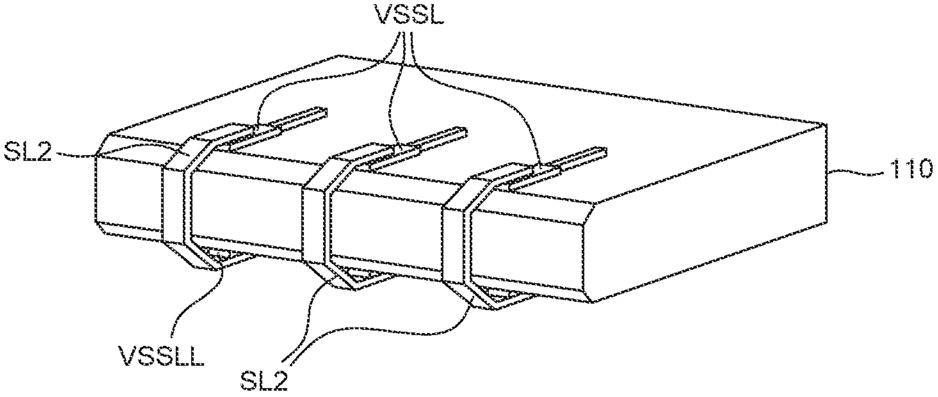
FIG. 6B is a perspective view illustrating a structure in which side lines are connected to the lines of FIG. 6A.
Figure 6C:
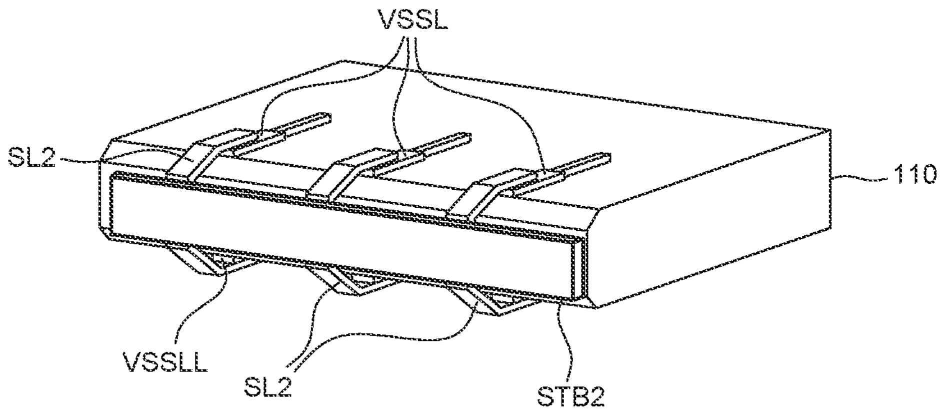
FIG. 6C is a perspective view illustrating a structure in which a shorting bar is disposed on the side lines of FIG. 6B.
Figure 6D:
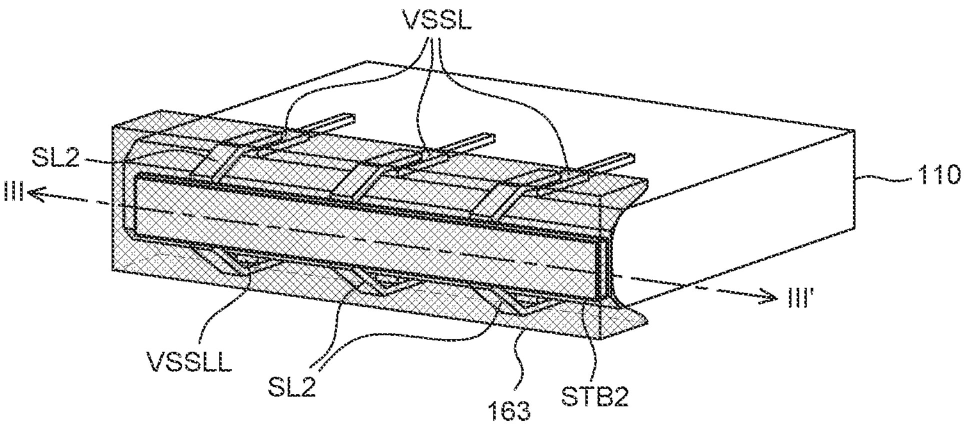
FIG. 6D is a perspective view illustrating a structure in which a black insulating layer covers the shorting bar of FIG. 6C.
Figure 6E:
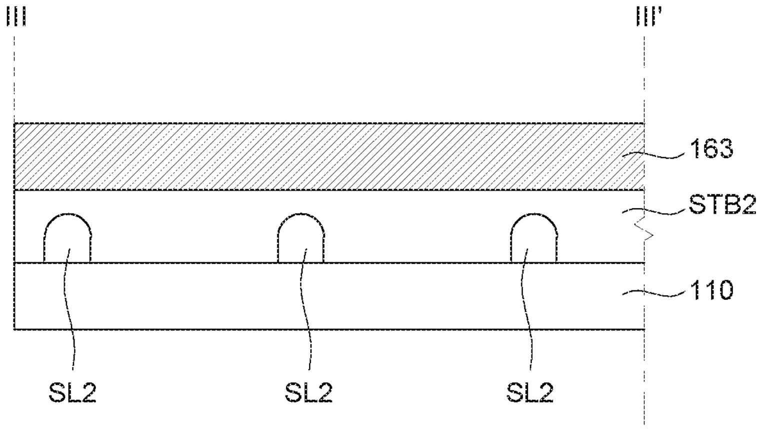
FIG. 6E is a schematic cross-sectional view as taken along a line III-III' of FIG. 6D.

FIG. 6A is a perspective view schematically illustrating the layout of lines in the portion B1 of FIG. 1 and the portion B2 of FIG. 2. FIG. 6B is a perspective view illustrating a structure in which side lines are connected to the lines of FIG. 6A. FIG. 6C is a perspective view illustrating a structure in which a shorting bar is disposed on the side lines of FIG. 6B. FIG. 6D is a perspective view illustrating a structure in which a black insulating layer covers the shorting bar of FIG. 6C. FIG. 6E is a schematic cross-sectional view as taken along a line III-III' of FIG. 6D. For the convenience of description, FIG. 6A through FIG. 6F illustrate the first sub-substrate 111 and the second sub-substrate 112 bonded to the first sub-substrate 111 as the single substrate 110.

Referring to FIG. 6A and FIG. 6B, the plurality of low potential voltage lines VSSL as the second upper lines is disposed at the other side on the top surface of the substrate 110. Further, the plurality of low potential voltage link lines VSSLL as the second lower lines is disposed at other side on the rear surface of the substrate 110 so as to correspond in position to the second upper lines, respectively. Further, the second side lines SL2 are disposed at the other side on a side surface of the substrate 110 so as to correspond in position to the second upper lines and the second lower lines, respectively. As shown in FIG. 6B, parts of end portions of the side lines can be formed to overlap end portions of the upper lines on the top surface of the substrate 110. Further, the parts of the end portions of the side lines can be formed to overlap end portions of the lower lines on the rear surface of the substrate 110.

Referring to FIG. 6C, the second shorting bar STB2 is disposed on the second side line SL2 disposed at the other side on the side surface of the substrate 110. Thus, the second shorting bar STB2 electrically connects the plurality of second side lines SL2 that connects the plurality of low potential voltage lines VSSL to the plurality of low potential voltage link lines VSSLL.

Referring to FIG. 6D, a third insulating layer 163 is disposed to cover the second shorting bar STB2 and all of the exposed parts of the plurality of second side lines SL2 disposed at the other side on the side surface of the substrate 110.

If the plurality of second side lines SL2 and the second shorting bar STB2 are made of a metal material, external light or light from the light emitting diode can be reflected and then visually recognized by the user. Therefore, the third insulating layer 163 can be made of a black material or can include a black material. Accordingly, it is possible to suppress a light leakage between adjacent display devices 100 according to an exemplary embodiment of the present disclosure when an ultra-large screen is implemented by disposing the display devices 100 in the form of tiles.

FIG. 6E is a cross-sectional view as taken along the line III-III' of FIG. 6D. Herein, the third insulating layer 163 is coupled to cover the second shorting bar STB2 extending in a direction along the III-III' and all of the plurality of second side lines SL2.

As shown in FIG. 6E, the plurality of second side lines SL2 is disposed at a predetermined interval from each other on the substrate 110. Further, the second shorting bar STB2 is disposed on the plurality of second side lines SL2, and the third insulating layer 163 is disposed on the second shorting bar STB2.

Figure 7:
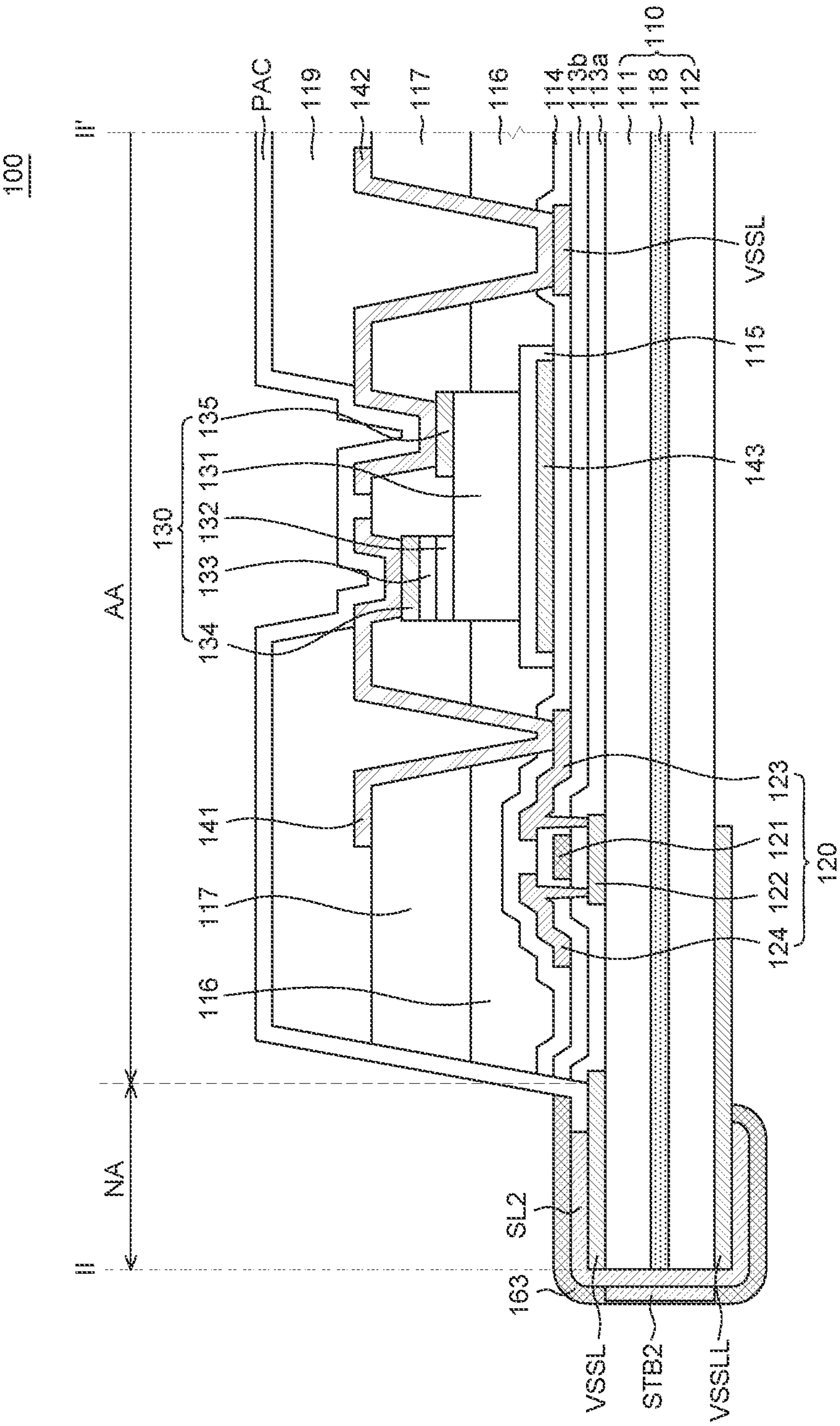
FIG. 7 is a cross-sectional view as taken along a line II-II' of FIG. 5.

FIG. 7 is a cross-sectional view as taken along a line II-II' of FIG. 5. FIG. 7 is a cross-sectional view of a part of an area where the low potential voltage line VSSL is disposed on the other side of the substrate 110 and the pixel PX is disposed on the first sub-substrate 111 as shown in FIG. 5.

First, various components of the display device 100 disposed in the active area AA of the substrate will be described.

A transistor 120 is disposed on the first sub-substrate 111. Specifically, an active layer 122 is disposed on the first sub-substrate 111, and a gate electrode 121 is disposed on the active layer 122. A gate insulating layer 113*a* for insulating the gate electrode 121 and the active layer 122 is disposed between the active layer 122 and the gate electrode 121. An interlayer insulating layer 113*b* is disposed on the gate electrode 121, and a source electrode 123 and a drain electrode 124 each connected to the active layer 122 are disposed on the interlayer insulating layer 113*b*.

The low potential voltage line VSSL is disposed on the first sub-substrate 111. The low potential voltage line VSSL can be made of the same material on the same layer as the gate electrode 121. The gate insulating layer 113*a* is disposed on a part of the low potential voltage line VSSL. Although FIG. 7 illustrates the low potential voltage line VSSL, the gate line GL, the data line DL, and the high potential voltage line VDDL can also be formed in the same manner as the low potential voltage line VSSL.

The low potential voltage line VSSL contacts the gate insulating layer 113*a*. The low potential voltage line VSSL serves to apply a low potential voltage, for example, a common voltage, to an LED 130, and can be spaced apart from the gate line GL or the data line DL. Further, the low potential voltage line VSSL can extend in the same direction as the data line DL. The low potential voltage line VSSL can be made of the same material on the same layer as the source electrode 123 and the drain electrode 124 of the transistor 120.

A passivation layer 114 is disposed on the gate insulating layer 113*a*, the transistor 120, and the low potential voltage line VSSL. The passivation layer 114 can be disposed on the transistor 120 to protect the source electrode 123 and the drain electrode 124 of the transistor 120. However, the passivation layer 114 can be omitted in some exemplary embodiments of the present disclosure.

A plurality of reflective layers 143 is disposed on the passivation layer 114. The reflective layer 143 serves to reflect light, which is emitted from the LED 130 toward the first sub-substrate 111, to the above of the display device 100 so that the light exits to the outside of the display device 100. The reflective layer 143 can be made of a metal material having high reflectance.

An adhesive layer 115 covering the plurality of reflective layers 143 is disposed on the reflective layer 143. The adhesive layer 115 serves to bond the LED 130 to the reflective layer 143, and can also insulate the LED 130 from the reflective layer 143 made of a metal material. The adhesive layer 115 can be made of a thermosetting material or a photocurable material, but is not limited thereto. FIG. 7 illustrates that the adhesive layer 115 covers only the reflective layer 143. However, the position of the adhesive layer 115 is not limited thereto.

A plurality of LEDs 130 is disposed on the adhesive layer 115. The plurality of LEDs 130 is disposed overlapping the plurality of reflective layers 143. Each of the plurality of LEDs 130 includes an n-type layer 131, an active layer 132, a p-type layer 133, an n-electrode 135, and a p-electrode 134. In the following description, an LED having a lateral structure is employed as the LED 130. However, the structure of the LED 130 is not limited thereto.

Specifically, the n-type layer 131 of the LED 130 is disposed on the adhesive layer 115 to overlap the reflective layer 143. The n-type layer 131 can be formed by implanting n-type impurities into gallium nitride having excellent crystallinity. The active layer 132 is disposed on the n-type layer 131. The active layer 132 is an emission layer of the LED 130 that emits light and can be made of a nitride semiconductor such as indium gallium nitride. The p-type layer 133 is disposed on the active layer 132. The p-type layer 133 can be formed by implanting p-type impurities into gallium nitride. However, the materials of the n-type layer 131, the active layer 132, and the p-type layer 133 are not limited thereto.

The p-electrode 134 is disposed on the p-type layer 133 of the LED 130. Further, the n-electrode 135 is disposed on the n-type layer 131 of the LED 130. The n-electrode 135 is spaced apart from the p-electrode 134. Specifically, after the n-type layer 131, the active layer 132, and the p-type layer 133 are sequentially laminated, a predetermined portion of the active layer 132 and the p-type layer 133 can be etched out and the n-electrode 135 and the p-electrode 134 can be formed. In this way, the LED 130 can be fabricated. Herein, the predetermined portion is a space for separating the n-electrode 135 from the p-electrode 134. The predetermined portion can be etched out to expose a part of the n-type layer 131. In other words, the surface of the LED 130 on which the n-electrode 135 and the p-electrode 134 are disposed is not flat, but can have different levels. Thus, the p-electrode 134 is disposed on the p-type layer 133 and the n-electrode 135 is disposed on the n-type layer 131. Therefore, the p-electrode 134 and the n-electrode 135 are disposed to be spaced apart from each other at different levels. Thus, the n-electrode 135 can be disposed more adjacent to the reflective layer 143 than the p-electrode 134. Further, the n-electrode 135 and p-electrode 134 can be made of a conductive material, for example, a transparent conductive oxide. The n-electrode 135 and p-electrode 134 can be made of the same material, but are not limited thereto.

A first planarization layer 116 is disposed on the transistor 120. The first planarization layer 116 serves to planarize a top surface of the transistor 120. The first planarization layer 116 can be disposed to planarize the top surface of the transistor 120 in an area except the area where the LED 130 is disposed.

A second planarization layer 117 is disposed on the first planarization layer 116 and the LED 130. The second planarization layer 117 serves to planarize top surfaces of the transistor 120 and the LED 130. FIG. 7 illustrates two planarization layers, i.e., the first planarization layer 116 and the second planarization layer 117. However, the present disclosure is not limited thereto. The display device 100 can include a single planarization layer. If the single planarization layer is disposed, it is possible to suppress an excessive increase in time taken for the manufacturing process. The planarization layers can be composed of two or more layers. Meanwhile, in the exemplary embodiments of the present disclosure, at least one of the insulating layers disposed on the side lines or/and the shorting bars can be made of the same material as the planarization layers.

A first electrode 141 and a second electrode 142 are disposed on the first planarization layer 116 and the second planarization layer 117. The first electrode 141 serves to electrically connect the transistor 120 and the LED 130. The first electrode 141 is connected to the p-electrode 134 of the LED 130 through a contact hole formed in the second planarization layer 117. Further, the first electrode 141 is connected to the source electrode 123 of the transistor 120 through a contact hole formed in the first planarization layer 116, the second planarization layer 117, the passivation layer 114, and the adhesive layer 115. However, the present disclosure is not limited thereto. The first electrode 141 can be connected to the drain electrode 124 of the transistor 120 depending on the type of the transistor 120. The p-electrode 134 of the LED 130 can be electrically connected to the source electrode 123 of the transistor 120 by the first electrode 141.

The second electrode 142 serves to electrically connect the LED 130 and the low potential voltage line VSSL. Specifically, the second electrode 142 is connected to the low potential voltage line VSSL through a contact hole formed in the first planarization layer 116, the second planarization layer 117, the passivation layer 114, and the adhesive layer 115. Further, the second electrode 142 is connected to the n-electrode 135 of the LED 130 through a contact hole formed in the second planarization layer 117. Therefore, the low potential voltage line VSSL is electrically connected to the n-electrode 135 of the LED 130.

When the display device 100 is turned on, voltages of different levels can be applied to the source electrode 123 of the transistor 120 and the high potential voltage line VDDL, respectively. A high potential voltage applied to the source electrode 123 of the transistor 120 can be applied to the first electrode 141, and a low potential voltage can be applied to the second electrode 142. The voltages of different levels can be applied to the p-electrode 134 and the n-electrode 135 through the first electrode 141 and the second electrode 142. Thus, the LED 130 can emit light.

FIG. 7 illustrates that the transistor 120 is electrically connected to the p-electrode 134, and the low potential voltage line VSSL is electrically connected to the n-electrode 135. However, the present disclosure is not limited thereto. The transistor 120 can be electrically connected to the n-electrode 135, and the low potential voltage line VSSL can be electrically connected to the p-electrode 134.

A bank 119 is disposed on the second planarization layer 117, the first electrode 141, and the second electrode 142. The bank 119 serves as an insulating layer that defines an emission area. The bank 119 is disposed to overlap a tip end of the reflective layer 143, and a part of the reflective layer 143 which does not overlap the bank 119 can be defined as an emission area. The bank 119 can be made of an organic insulating material, and can be made of the same material as the first planarization layer 116 and/or the second planarization layer 117. Further, the bank 119 can include a black material in order to suppress color mixing caused by transmission of light emitted from the LED 130 to an adjacent pixel PX. Meanwhile, in the exemplary embodiments of the present disclosure, at least one of the insulating layers disposed on the side lines or/and the shorting bars can be made of the same material as the bank.

A protection layer PAC is disposed on the bank 119. The protection layer PAC covers a top surface of the bank 119 and a side surface of each of the bank 119, the second planarization layer 117, and the first planarization layer 116. Herein, an end portion of the protection layer PAC can be disposed to be in contact with a part of the low potential voltage line VSSL, which is an upper line disposed at one side on the top surface of the substrate 110. The protection layer PAC can serve to planarize an upper part of the substrate 110.

A bonding layer 118 is disposed between the first sub-substrate 111 and the second sub-substrate 112. The bonding layer 118 serves to bond the first sub-substrate 111 and the second sub-substrate 112. The first sub-substrate 111 and the second sub-substrate 112 can be bonded to each other through a bonding process. Specifically, the bonding layer 118 can be made of a material that is cured by various curing methods and can bond the first sub-substrate 111 and the second sub-substrate 112. The bonding layer 118 can be disposed entirely or partially between the first sub-substrate 111 and the second sub-substrate 112.

The first sub-substrate 111 and the second sub-substrate 112 shown in FIG. 7 can be substrates after a scribing process. Specifically, a scribing line can be defined on the first sub-substrate 111 and the second sub-substrate 112. The scribing line is a virtual line for cutting the display device 100 into cell units after the bonding process of the first sub-substrate 111 and the second sub-substrate 112. For example, the display device 100 can be formed simultaneously by a plurality of devices and then cut into cell units along the scribing line. Accordingly, the first sub-substrate 111 and the second sub-substrate 112 shown in FIG. 7 can be cell unit substrates cut and separated along the scribing line.

The second side line SL2 is disposed on an edge of the first sub-substrate 111 and the second sub-substrate 112. The second side line SL2 connects a line disposed on the first sub-substrate 111 and a line disposed under the second sub-substrate 112. Further, as shown in FIG. 7, the second side line SL2 can be disposed on the top surface and the side surface of the first sub-substrate 111 and on the side surface and the rear surface of the second sub-substrate 112.

The low potential voltage link line VSSLL is connected to the low potential voltage line VSSL disposed on the top surface of the first sub-substrate 111 through the second side line SL2. Thus, a low potential voltage applied to the low potential voltage link line VSSLL can be transmitted to each of the plurality of pixels PX.

FIG. 7 illustrates the second side line SL2 that connects the low potential voltage line VSSL to the low potential voltage link line VSSLL. However, the first side lines SL1-1, SL1-2 and SL1-3 for respectively connecting the high potential voltage line VDDL to the high potential voltage link line VDDLL, the data line DL to the data link line DLL, and the gate line GL to the gate link line GLL can also be disposed in the same manner.

The second shorting bar STB2 is disposed on at least a part of the second side line SL2, and the third insulating layer 163 is disposed on the second side line SL2 and the second shorting bar STB2. The third insulating layer 163 serves to cover and insulate the second shorting bar STB2 and the second side line SL2.

Meanwhile, the flexible film can be disposed under the substrate 110, i.e., on the rear surface of the second sub-substrate 112. Specifically, the flexible film can be bonded to a printed circuit board and can transmit various signals from the printed circuit board to the plurality of pixels PX. For example, the flexible film supplies the plurality of pixels PX with a high potential voltage and a low potential voltage applied from the printed circuit board. Further, the flexible film processes and transmits a driving signal for displaying an image.

Figure 8:
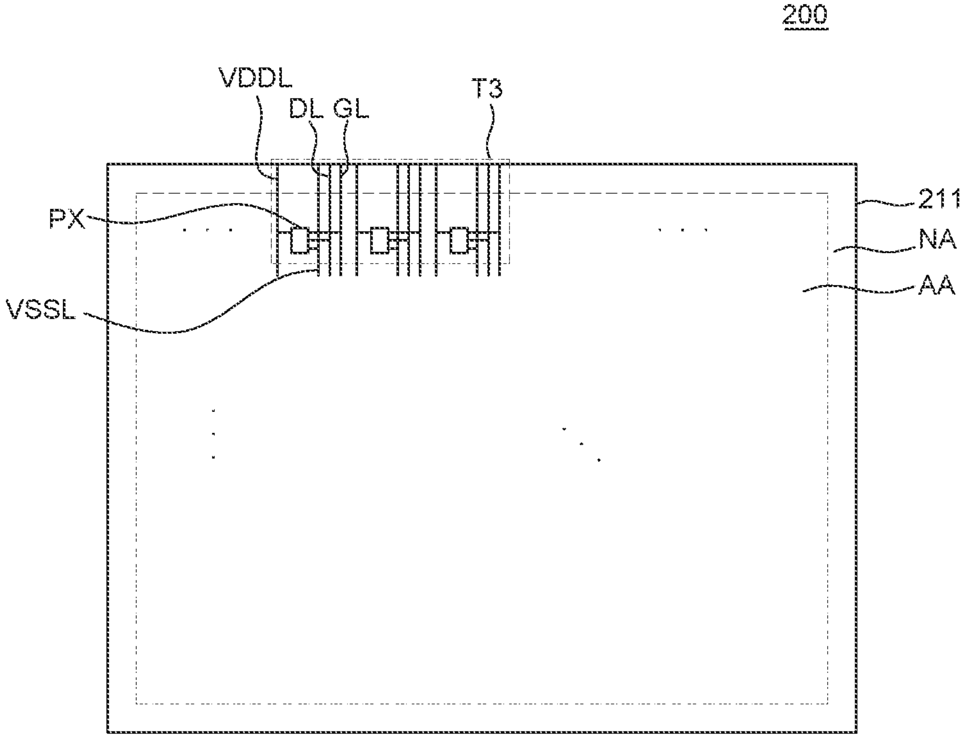
FIG. 8 is a schematic top view of a display device according to another exemplary embodiment of the present disclosure.
Figure 9:
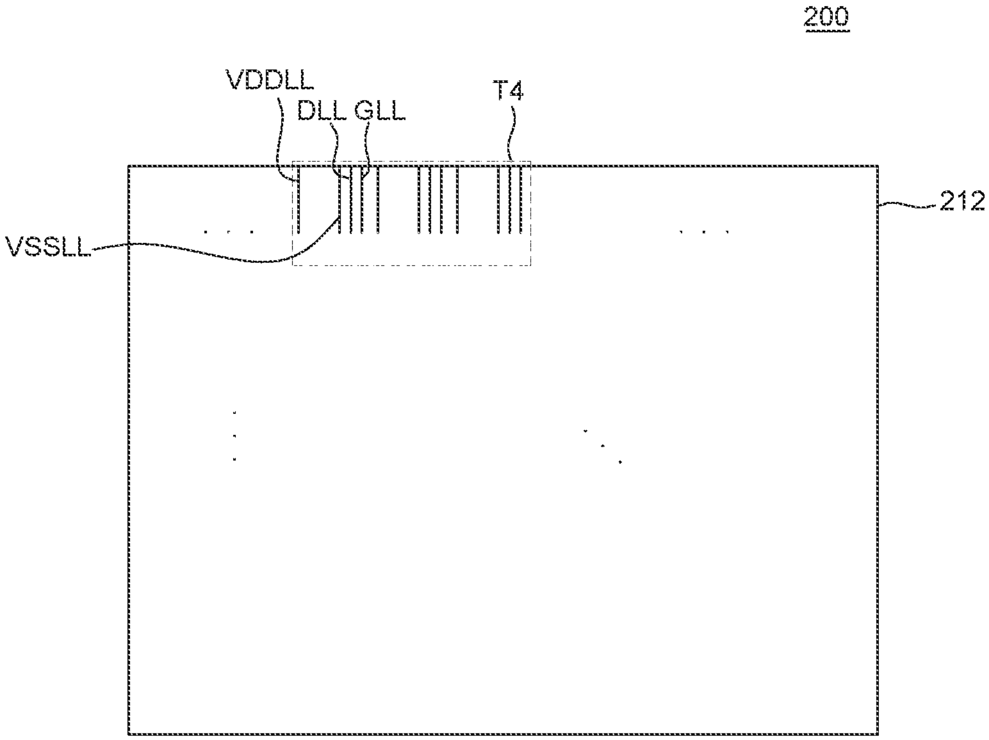
FIG. 9 is a schematic rear view of the display device according to another exemplary embodiment of the present disclosure.

FIG. 8 is a schematic top view of a display device according to another exemplary embodiment of the present disclosure. FIG. 9 is a schematic rear view of the display device according to another exemplary embodiment of the present disclosure. A display device 200 shown in FIG. 8 and FIG. 9 is substantially the same as the display device 100 shown in FIG. 1 through FIG. 7 except that all of a plurality of upper lines, a plurality of lower lines, and a plurality of side lines are disposed on one side of a substrate. Therefore, a repeated description thereof will be omitted or may be provided briefly.

Referring to FIG. 8, the plurality of high potential voltage lines VDDL and the plurality of low potential voltage lines VSSL as upper lines and the plurality of data lines DL and the plurality of gate lines GL as driving lines are disposed at one side on a top surface of a first sub-substrate 211.

Referring to FIG. 9, the plurality of high potential voltage link lines VDDLL, the plurality of low potential voltage link lines VSSLL, the plurality of data link lines DLL, and the plurality of gate link lines GLL as lower lines are disposed at one side on a rear surface of a second sub-substrate 212.

Figure 10:
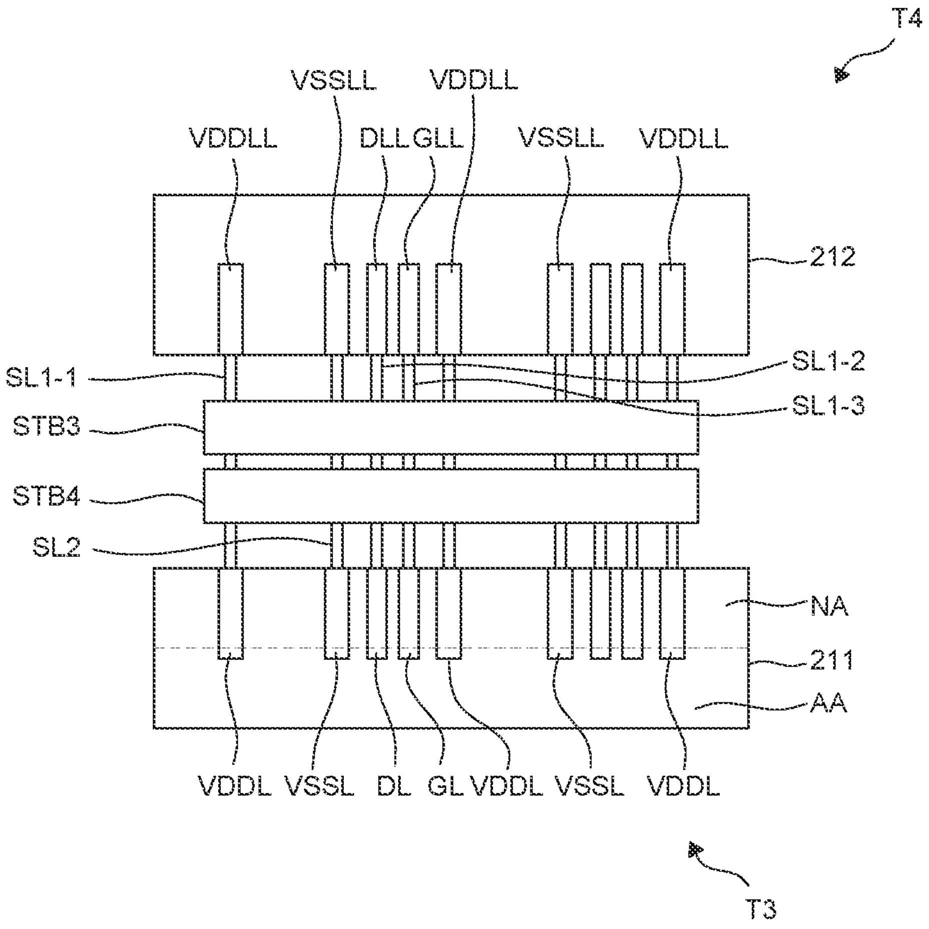
FIG. 10 is a plan view schematically illustrating the layout of lines in a portion T3 of FIG. 8 and a portion T4 of FIG. 9.

FIG. 10 is a plan view schematically illustrating the layout of lines in a portion T3 of FIG. 8 and a portion T4 of FIG. 9. FIG. 10 illustrates the portion T3 of FIG. 8 on the lower side, the portion T4 of FIG. 9 on the upper side, and a side surface of the substrate between the portions T3 and T4.

The display device 200 according to another exemplary embodiment of the present disclosure includes the upper lines disposed on the top surface of the substrate, and the lower lines disposed on the rear surface of the substrate as described above with reference to FIG. 8 and FIG. 9. Further, the display device 200 includes a plurality of side lines disposed on the side surface of the substrate and connecting the upper lines to the lower lines, respectively, and a shorting bar connecting at least some of the plurality of side lines.

Referring to FIG. 10, the display device 200 includes the plurality of first-first side lines SL1-1, the plurality of first-second side lines SL1-2, the plurality of first-third side lines SL1-3, and the second side line SL2. They are disposed at one side on side surfaces of the first sub-substrate 211 and the second sub-substrate 212 and connect the plurality of upper lines to the plurality of lower lines, respectively. Further, the display device 200 includes a third shorting bar STB3 electrically connecting the plurality of first-first side lines SL1-1 and a fourth shorting bar STB4 electrically connecting the plurality of second side lines SL2.

As described above, the third shorting bar STB3 is disposed to electrically connect the side lines SL1-1 connected to the plurality of high potential voltage lines VDDL, respectively. Further, the fourth shorting bar STB4 is disposed to electrically connect the second side lines SL2 connected to the plurality of low potential voltage lines VSSL, respectively. Thus, it is possible to reduce a line resistance caused by the high potential voltage line VDDL and the low potential voltage line VSSL to which a constant voltage is applied. Further, the shorting bars are disposed on the side surface of the substrate. Thus, the widths of the shorting bars can be set more freely on the side surface than on the spatially limited top surface or rear surface of the substrate. Therefore, it is possible to more effectively reduce the line resistance. Accordingly, it is also possible to improve a heat generation defect. Furthermore, the first-first side line SL1-1 respectively connected to the plurality of high potential voltage lines VDDL and the second side line SL2 respectively connected to the plurality of low potential voltage lines VSSL are disposed on the side surface of the substrate. Thus, it is possible to implement a zero-bezel.

Hereinafter, the layout of the lines disposed on one side of the substrate of the display device 200 illustrated in FIG. 10 will be described in detail with reference to FIG. 11A through FIG. 11F.

Figure 11A:
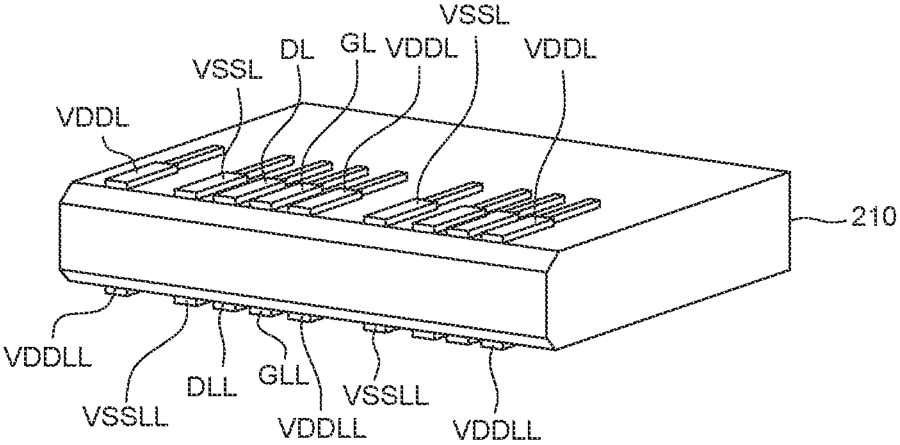
FIG. 11A is a perspective view schematically illustrating the layout of lines in the portion T3 of FIG. 8 and the portion T4 of FIG. 9.
Figure 11B:
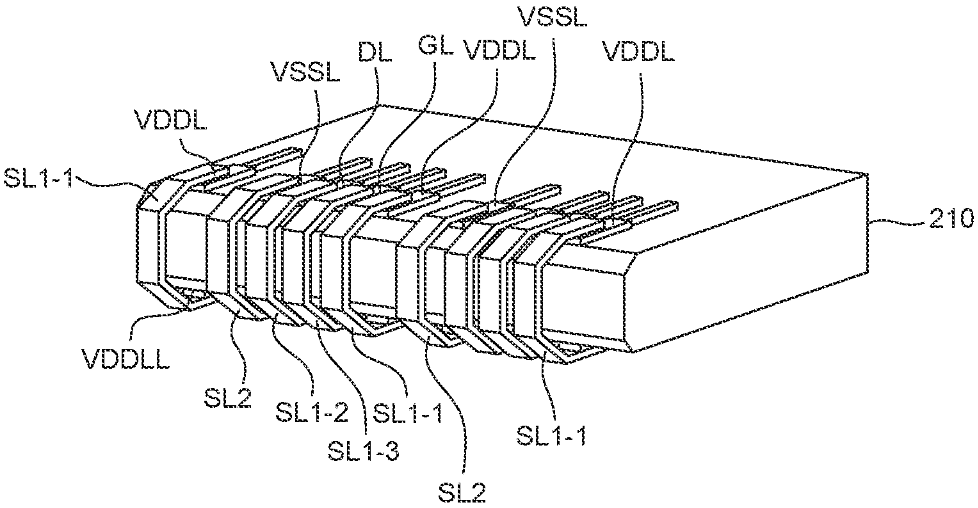
FIG. 11B is a perspective view illustrating a structure in which side lines are connected to the lines of FIG. 11A.
Figure 11C:
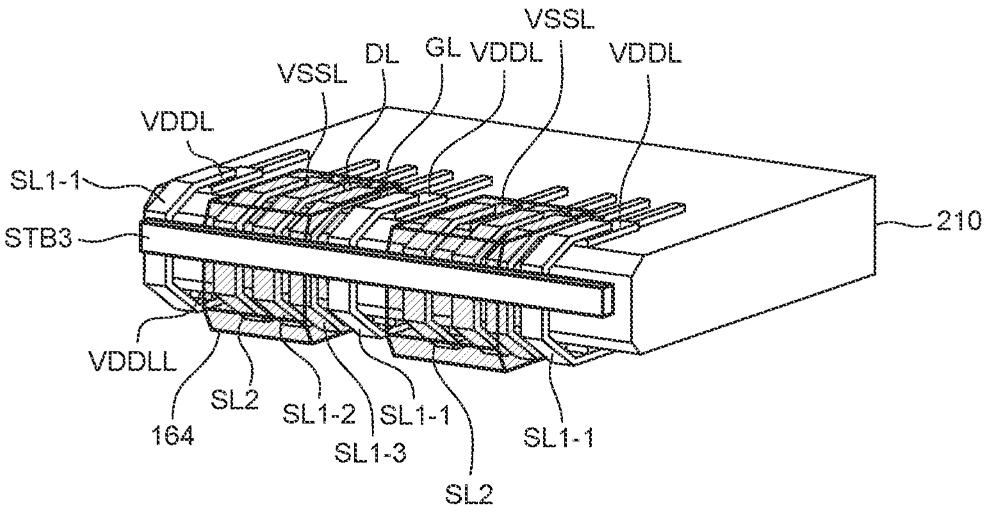
FIG. 11C is a perspective view illustrating a structure in which an insulating layer is disposed on some of the side lines of FIG. 11B and a shorting bar is disposed on the insulating layer.
Figure 11D:
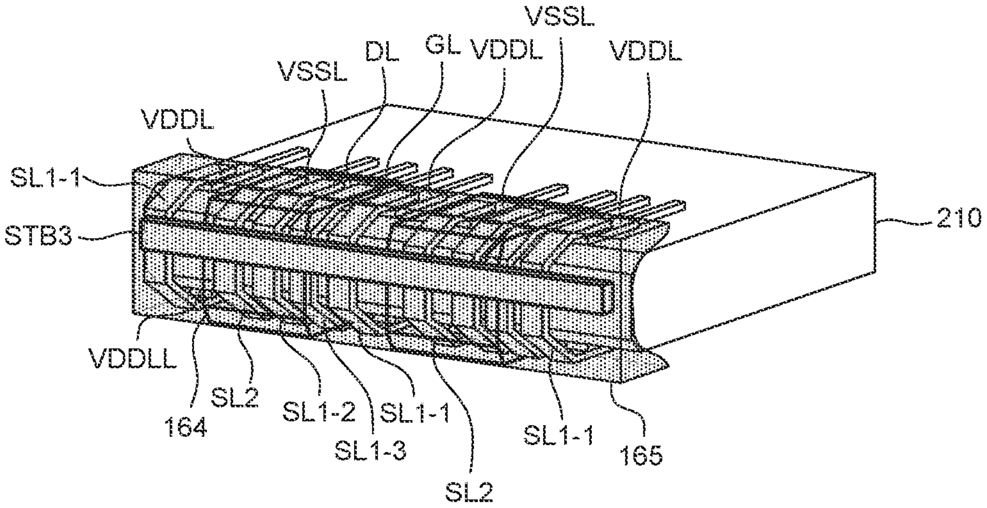
FIG. 11D is a perspective view illustrating a structure in which another insulating layer is disposed on the shorting bar of FIG. 11C.
Figure 11E:
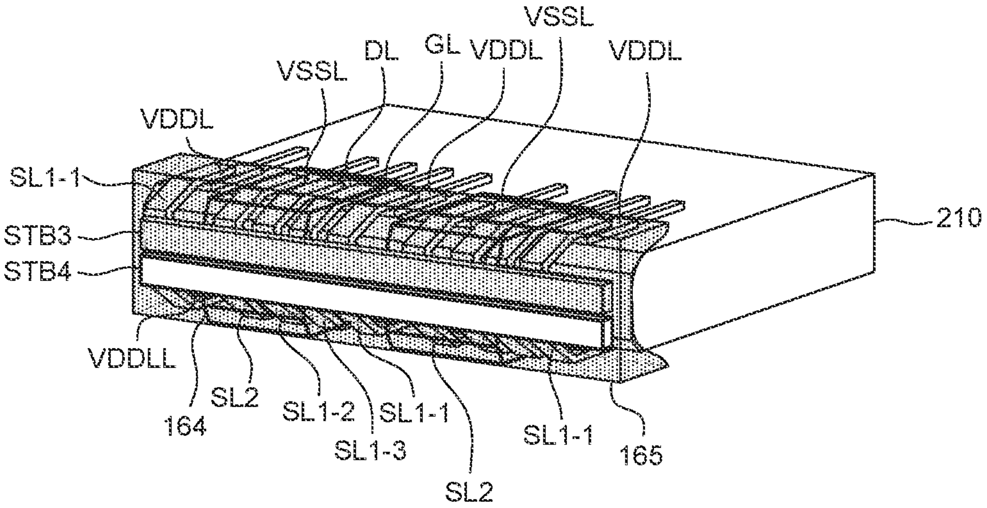
FIG. 11E is a perspective view illustrating a structure in which another shorting bar is disposed on the other insulating layer of FIG. 11D.
Figure 11F:
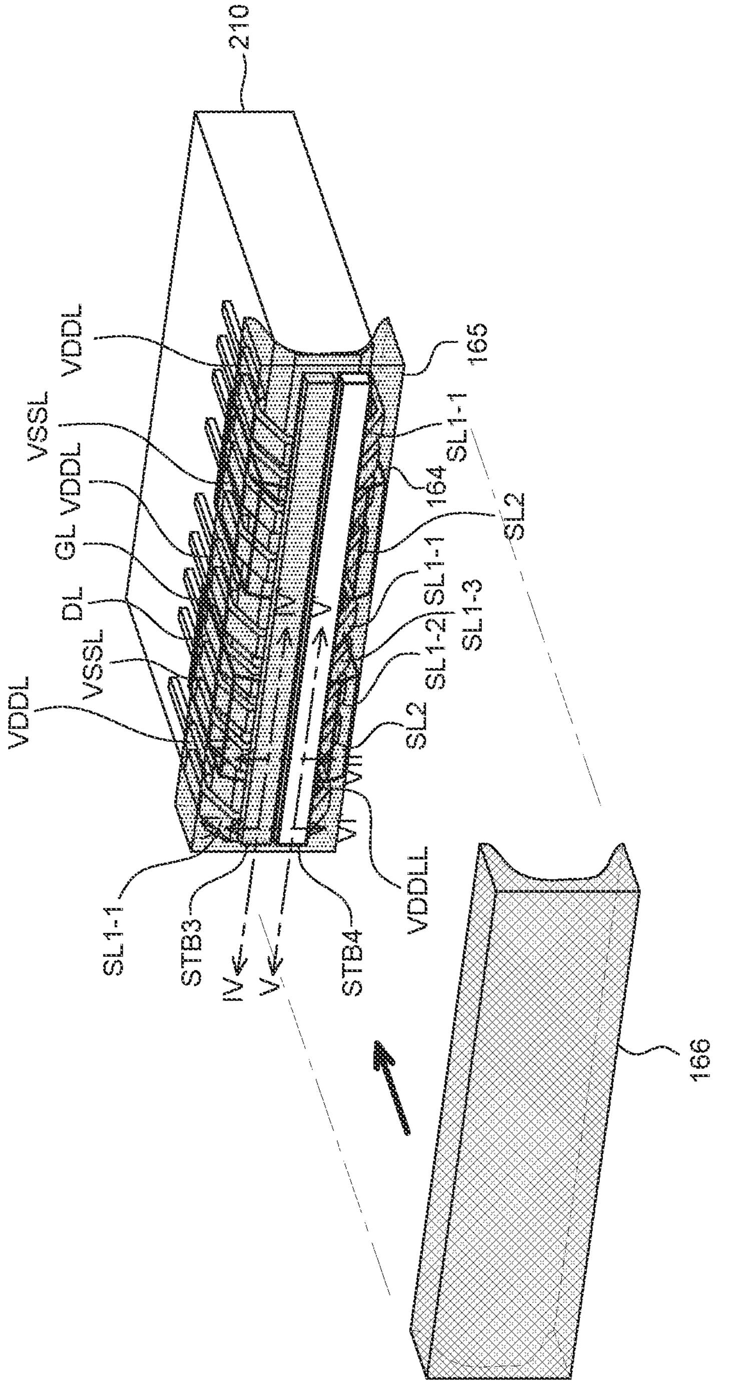
FIG. 11F is a perspective view illustrating a structure in which a black insulating layer covers the other shorting bar of FIG. 11E.
Figure 12A:
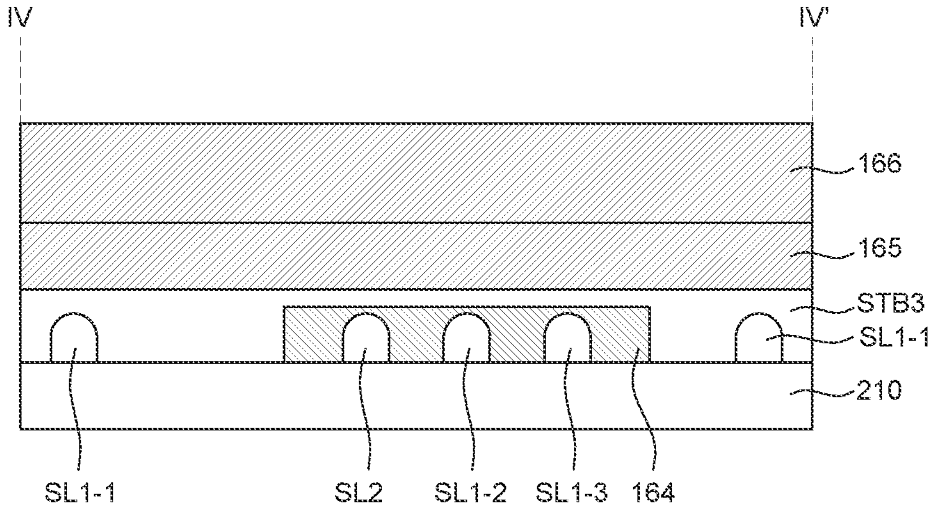
FIG. 12A is a cross-sectional view as taken along a line IV-IV' of FIG. 11F.
Figure 12B:
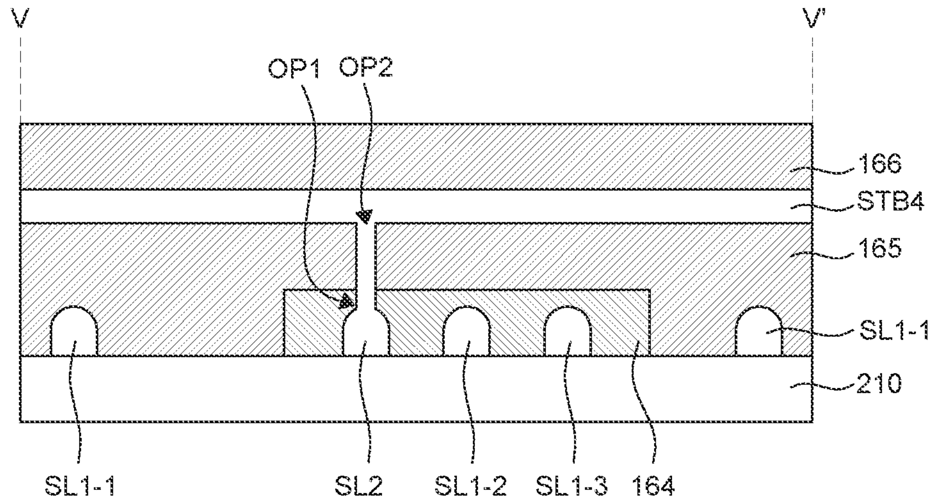
FIG. 12B is a cross-sectional view as taken along a line V-V' of FIG. 11F.
Figure 12C:
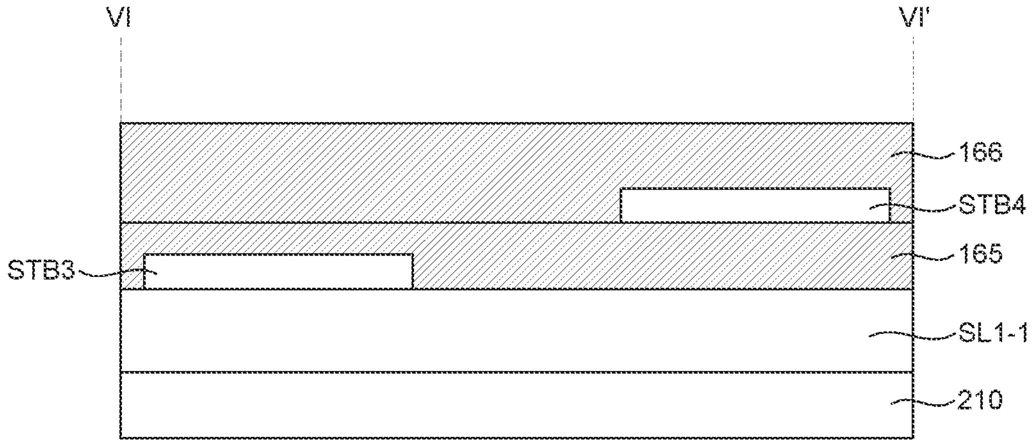
FIG. 12C is a cross-sectional view as taken along a line VI-VI' of FIG. 11F.
Figure 12D:
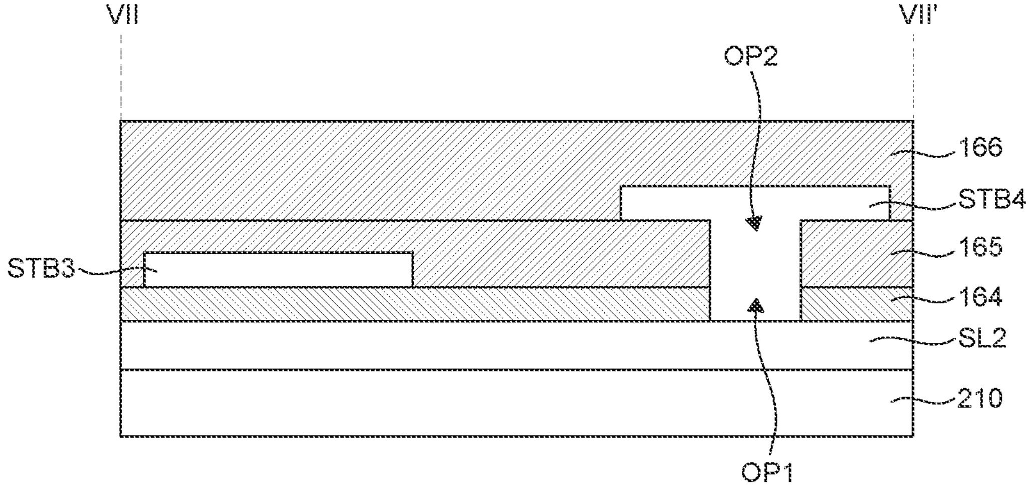
FIG. 12D is a cross-sectional view as taken along a line VII-VII' of FIG. 11F.

FIG. 11A is a perspective view schematically illustrating the layout of lines in the portion T3 of FIG. 8 and the portion T4 of FIG. 9. FIG. 11B is a perspective view illustrating a structure in which side lines are connected to the lines of FIG. 11A. FIG. 11C is a perspective view illustrating a structure in which an insulating layer is disposed on some of the side lines of FIG. 11B and a shorting bar is disposed on the insulating layer. FIG. 11D is a perspective view illustrating a structure in which another insulating layer is disposed on the shorting bar of FIG. 11C. FIG. 11E is a perspective view illustrating a structure in which another shorting bar is disposed on the another insulating layer of FIG. 11D. FIG. 11F is a perspective view illustrating a structure in which a black insulating layer covers the other shorting bar of FIG. 11E. FIG. 12A is a schematic cross-sectional view as taken along a line IV-IV' of FIG. 11F. FIG. 12B is a schematic cross-sectional view as taken along a line V-V' of FIG. 11F. FIG. 12C is a schematic cross-sectional view as taken along a line VI-VI' of FIG. 11F. FIG. 12D is a schematic cross-sectional view as taken along a line VII-VII' of FIG. 11F.

FIG. 11A through FIG. 12D illustrate the first sub-substrate 211 and the second sub-substrate 212 bonded to the first sub-substrate 211 as a single substrate 210.

Referring to FIG. 11A and FIG. 11B, the high potential voltage line VDDL, the low potential voltage line VSSL, the data line DL, and the gate line GL as upper lines are disposed at one side on a top surface of the substrate 210. Further, the high potential voltage link line VDDLL, the low potential voltage link line VSSLL, the data link line DLL, and the gate link line GLL as lower lines are disposed at one side on a rear surface of the substrate 210 so as to correspond in position to the upper lines, respectively. Further, the first-first side line SL1-1, the second side line SL2, the first-second side line SL1-2, and the first-third side line SL1-3 as side lines are disposed at one side on a side surface of the substrate 210 so as to correspond in position to the upper lines and the lower lines, respectively.

The display device 200 according to another exemplary embodiment of the present disclosure includes the high potential voltage line VDDL and the low potential voltage line VSSL disposed on one side of the substrate 210. Thus, the shorting bars for the respective lines are also disposed at one side on the side surface of the substrate 210. Therefore, the display device 200 includes a plurality of insulating layers for insulating the third shorting bar STB3 and the fourth shorting bar STB4 to suppress a short. Herein, the third shorting bar STB3 connects the plurality of first-first side lines SL1-1 connected to the plurality of high potential voltage lines VDDL. Further, the fourth shorting bar STB4 connects the plurality of second side lines SL2 connected to the plurality of low potential voltage lines VSSL.

Referring to FIG. 11C, a fourth insulating layer 164 is disposed to cover the second side line SL2, the first-second side line SL1-2, and the first-third side line SL1-3 disposed at one side on the side surface of the substrate 210. The fourth insulating layer 164 does not overlap the first-first side line SL1-1.

Further, the third shorting bar STB3 is disposed on the first-first side line SL1-1 and the fourth insulating layer 164. Thus, the third shorting bar STB3 electrically connects the plurality of first-first side lines SL1-1 that connects the plurality of high potential voltage lines VDDL to the plurality of high potential voltage link lines VDDLL. Further, the third shorting bar STB3 is insulated from the second side line SL2, the first-second side line SL1-2, and the first-third side line SL1-3 that connect the other upper lines and lower lines.

FIG. 11C illustrates that the third shorting bar STB3 electrically connecting the plurality of first-first side lines SL1-1 connected to the plurality of high potential voltage lines VDDL is formed first. However, the fourth shorting bar STB4 electrically connecting the plurality of second side lines SL2 connected to the plurality of low potential voltage lines VSSL can be formed first. In this case, the fourth insulating layer 164 is disposed to cover the plurality of first-first side lines SL1-1 as well as the first-second side line SL1-2 and the first-third side line SL1-3. The fourth insulating layer 164 does not overlap the second side line SL2.

Referring to FIG. 11D and FIG. 11E, a fifth insulating layer 165 is disposed to cover the third shorting bar STB3, the fourth insulating layer 164, and all of exposed parts of the plurality of first-first side lines SL1-1 disposed at one side on the side surface of the substrate 210. Further, the fourth shorting bar STB4 insulated from the third shorting bar STB3 is disposed on the fifth insulating layer 165. As shown in FIG. 11E, the third shorting bar STB3 and the fourth shorting bar STB4 extend in a direction intersecting an extension direction of the plurality of side lines. Further, the third shorting bar STB3 and the fourth shorting bar STB4 are spaced apart from each other and do not overlap each other.

The fourth shorting bar STB4 electrically connects the plurality of second side lines SL2 connected to the plurality of low potential voltage lines VSSL. To this end, each of the fourth insulating layer 164 and the fifth insulating layer 165 includes openings for exposing parts of the plurality of second side lines SL2, respectively. The openings in the fourth insulating layer 164 correspond in position to those in the fifth insulating layer 165. The fourth shorting bar STB4 is electrically connected to the plurality of second side lines SL2 through the openings formed in each of the fourth insulating layer 164 and the fifth insulating layer 165.

Referring to FIG. 11F, a sixth insulating layer 166 is disposed to cover the fourth shorting bar STB4 and the fifth insulating layer 165 disposed at one side on the side surface of the substrate 210. The sixth insulating layer 166 can be made of a black material or can include a black material. Accordingly, it is possible to suppress a light leakage between adjacent display devices 200 according to another exemplary embodiment of the present disclosure when an ultra-large screen is implemented by disposing the display devices 200 in the form of tiles.

FIG. 12A through FIG. 12D are cross-sectional views in various directions in a state where the sixth insulating layer 166 of FIG. 11F is coupled to cover all of the fourth shorting bar STB4 and the fifth insulating layer 165.

Referring to FIG. 12A, the third shorting bar STB3 extends in a direction along the line IV-IV'. In the section along the line IV-IV', the first-first side line SL1-1, the second side line SL2, the first-second side line SL1-2, and the first-third side line SL1-3 are repeatedly disposed on the substrate 210. Further, the fourth insulating layer 164 is disposed to cover the second side line SL2, the first-second side line SL1-2, and the first-third side line SL1-3. Further, the third shorting bar STB3 is disposed on the fourth insulating layer 164 and the first-first side line SL1-1 to electrically connect the plurality of first-first side lines SL1-1. Furthermore, the fifth insulating layer 165 is disposed on the third shorting bar STB3. The third shorting bar STB3 and the fourth shorting bar STB4 do not overlap each other. Therefore, the sixth insulating layer 166, which is a black insulating layer, is disposed on the fifth insulating layer 165 in the section along the line IV-IV'.

Referring to FIG. 12B, the fourth shorting bar STB4 extends in a direction along the line V-V'. In the section along the line V-V', the first-first side line SL1-1, the second side line SL2, the first-second side line SL1-2, and the first-third side line SL1-3 are repeatedly disposed on the substrate 210. Further, the fourth insulating layer 164 is disposed to cover the second side line SL2, the first-second side line SL1-2, and the first-third side line SL1-3. The third shorting bar STB3 and the fourth shorting bar STB4 do not overlap each other. In the section along the line V-V', the fifth insulating layer 165 is disposed on the first-first side line SL1-1 and the fourth insulating layer 164. Also, the fourth shorting bar STB4 is disposed on the fifth insulating layer 165 to electrically connect the plurality of second side lines SL2. Here, a first opening OP1 for exposing a part of the second side line SL2 is formed in the fourth insulating layer 164 at a position overlapping the second side line SL2 so that the fourth shorting bar STB4 is electrically connected to the second side line SL2. Further, a second opening OP2 is also formed in the fifth insulating layer 165 at a position corresponding to the first opening OP1 of the fourth insulating layer 164. Therefore, the fourth shorting bar STB4 disposed on the fifth insulating layer 165 is electrically connected to the second side line SL2 through the second opening OP2 and the first opening OP1. Further, the sixth insulating layer 166, which is a black insulating layer, is disposed on the fifth insulating layer 165.

Referring to FIG. 12C, the first-first side line SL1-1 extends in a direction along the line VI-VI'. In the section along the line VI-VI', the first-first side line SL1-1 is disposed on the substrate 210. Further, the third shorting bar STB3 is disposed on the first-first side line SL1-1 so as to be electrically connected to the first-first side line SL1-1. Further, the fifth insulating layer 165 is disposed on the third shorting bar STB3, and the fourth shorting bar STB4 is disposed on the fifth insulating layer 165 so as to be spaced apart from the third shorting bar STB3. Thus, the fourth shorting bar STB4 does not overlap the third shorting bar STB3. Furthermore, the sixth insulating layer 166, which is a black insulating layer, is disposed on the fourth shorting bar STB4 and the fifth insulating layer 165.

Referring to FIG. 12D, the second side line SL2 extends in a direction along the line VII-VII'. In the section along the line VII-VII', the second side line SL2 is disposed on the substrate 210, and the fourth insulating layer 164 is disposed on the second side line SL2. Further, the third shorting bar STB3 is disposed on the fourth insulating layer 164. Thus, the third shorting bar STB3 is insulated from the second side line SL2. Furthermore, the fifth insulating layer 165 is disposed on the third shorting bar STB3 and the fourth insulating layer 164. Further, the fourth shorting bar STB4 is disposed on the fifth insulating layer 165 so as to be spaced apart from the third shorting bar STB3. Thus, the fourth shorting bar STB4 does not overlap the third shorting bar STB3. Here, the first opening OP1 is formed in the fourth insulating layer 164, and the second opening OP2 is also formed in the fifth insulating layer 165 at a position corresponding to the first opening OP1. Therefore, the fourth shorting bar STB4 disposed on the fifth insulating layer 165 is electrically connected to the second side line SL2 through the first opening OP1 and the second opening OP2. Further, the sixth insulating layer 166, which is a black insulating layer, is disposed on the fourth shorting bar STB4 and the fifth insulating layer 165.

Figure 13A:
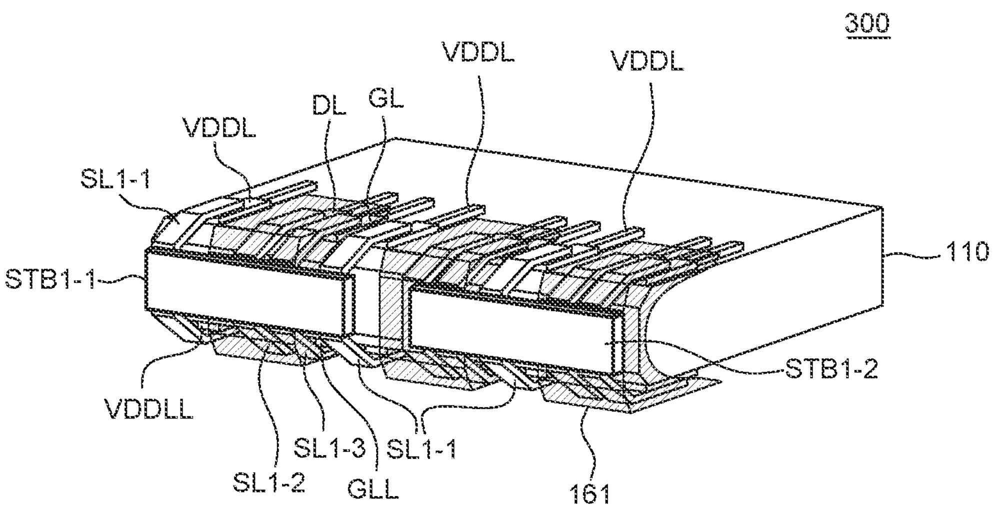
FIG. 13A is a perspective view illustrating an arrangement example of shorting bars in a display device according to yet another exemplary embodiment of the present disclosure.
Figure 13B:
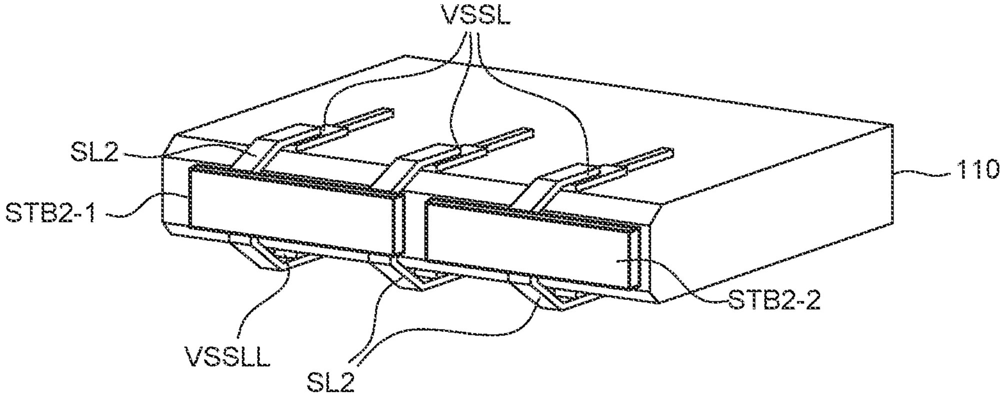
FIG. 13B is a perspective view illustrating another arrangement example of shorting bars in the display device according to yet another exemplary embodiment of the present disclosure.

FIG. 13A is a perspective view illustrating an arrangement example of shorting bars in a display device according to yet another exemplary embodiment of the present disclosure. FIG. 13B is a perspective view illustrating another arrangement example of shorting bars in a display device 300 according to yet another exemplary embodiment of the present disclosure.

FIG. 13A illustrates shorting bars connecting the plurality of first-first side lines SL1-1. The shorting bars include a first-first shorting bar STB1-1 connecting two or more first-first side lines SL1-1 and a first-second shorting bar STB1-2 connecting another two or more first-first side lines SL1-1. Herein, the number and size of first-first shorting bars STB1-1 and first-second shorting bars STB1-2 can be variously designed. Further, the number of first-first side lines SL1-1 connected to the first-first shorting bar STB1-1 and the first-second shorting bar STB1-2 can be variously designed.

FIG. 13B illustrates shorting bars connecting the plurality of second side lines SL2. The shorting bars include a second-first shorting bar STB2-1 connecting two or more second side lines SL2 and a second-second shorting bar STB2-2 connecting another two or more second side lines SL2. Herein, the number and size of second-first shorting bars STB2-1 and second-second shorting bars STB2-2 can be variously designed. Further, the number of second side lines SL2 connected to the second-first shorting bar STB2-1 and the second-second shorting bar STB2-2 can be variously designed.

Meanwhile, FIG. 13A shows an example where a plurality of shorting bars is disposed when the high potential voltage line VDDL, the data line DL, and the gate line GL are disposed at one side on the top surface of the substrate 110 as shown in FIG. 4C. FIG. 13B shows an example where a plurality of shorting bars is disposed when the low potential voltage lines VSSL are disposed at the other side on the top surface of the substrate 110 as shown in FIG. 6C. However, the layout of lines is not limited thereto. For example, as shown in FIG. 13A and FIG. 13B, a plurality of divided shorting bars can be disposed at at least one of one side and the other side on a side surface of the substrate.

Further, all of the high potential voltage line VDDL, the low potential voltage line VSSL, the data line DL, and the gate line GL can be disposed at one side on the top surface of the substrate 210 as shown in FIG. 11E. In this case, at least one of the third shorting bar STB3 connecting the first-first side line SL1-1 and the fourth shorting bar STB4 connecting the second side line SL2 can be divided into a plurality of shorting bars and disposed thereon.

To check whether an upper line and a lower line are normally connected to each other by a side line, a resistance between the upper line and the lower line can be measured. If a shorting bar is connected to the side line to reduce the line resistance as described above, a current path is formed along the shorting bar in a direction perpendicular to a resistance measurement path. Thus, it can be difficult to accurately measure a resistance between the upper line and the lower line.

Therefore, in the display device 300 according to yet another exemplary embodiment of the present disclosure, a plurality of divided shorting bars is disposed to reduce a line resistance and also increase the accuracy in measurement of resistance. For example, a shorting bar connecting the first-first side lines SL1-1 is divided into the first-first shorting bar STB1-1 and the first-second shorting bar STB1-2. Further, a shorting bar connecting the second side lines SL2 is divided into the second-first shorting bar STB2-1 and the second-second shorting bar STB2-2. As such, in the display device 300 according to yet another exemplary embodiment of the present disclosure, a shorting bar connecting side lines is divided into a plurality of shorting bars. Thus, it is possible to reduce a line resistance by using the shorting bars and also possible to increase the accuracy in measurement of resistance.

The exemplary embodiments of the present disclosure can also be described as follows:

According to an aspect of the present disclosure, there is provided a display apparatus. The display apparatus includes a substrate on which a plurality of light emitting diodes is disposed. The display apparatus further includes a plurality of first upper lines disposed at one side on a top surface of the substrate. The display apparatus further includes a plurality of first lower lines disposed at one side on a rear surface of the substrate. The display apparatus further includes a plurality of first side lines disposed on a side surface on one side of the substrate and electrically connected to the plurality of first upper lines and the plurality of first lower lines. And the display apparatus further includes a first shorting bar disposed at one side on the side surface of the substrate and electrically connecting at least some of the plurality of first side lines.

The display apparatus can further include: a plurality of second upper lines disposed at the other side on a top surface of the substrate; a plurality of second lower lines disposed at the other side on a bottom surface of the substrate; a plurality of second side lines disposed at the other side on a side surface of the substrate and electrically connected to the plurality of second upper lines and the plurality of second lower lines; and a second shorting bar disposed at the other side on the side surface of the substrate and electrically connecting at least some of the plurality of second side lines.

The plurality of first upper lines can include a plurality of high potential voltage lines and a plurality of driving lines. The plurality of second upper lines can include a plurality of low potential voltage lines. The plurality of driving lines can include at least one of a plurality of gate lines, a plurality of data lines, a plurality of reference voltage lines, and a plurality of emission signal lines.

The display apparatus can further include a first insulating layer that covers the plurality of second side lines and the second shorting bar.

The second shorting bar can be connected to all of the plurality of second side lines.

The second shorting bar can include a plurality of parts spaced apart from each other, and each of the plurality of parts of the second shorting bar can be connected to some of the plurality of second side lines.

The first shorting bar can be connected to all the first side lines connected to the plurality of high potential power lines among the plurality of first side lines.

The first shorting bar can include a plurality of parts spaced apart from each other. each of the plurality of parts of the first shorting bar can be connected to a part of the first side line connected to the plurality of high potential power lines among the plurality of first side lines.

The display apparatus can further include a second insulating layer that covers the first side lines connected to the plurality of driving lines among the plurality of first side lines. The first shorting bar can be disposed on the second insulating layer.

The display apparatus can further include a third insulating layer that covers the second insulating layer and the first shorting bar.

The plurality of first upper lines can include a plurality of low potential power lines, a plurality of high potential power lines, and a plurality of driving lines. The plurality of driving lines can include at least one of a plurality of gate lines, a plurality of data lines, a plurality of reference voltage lines, and a plurality of emission signal lines.

The display apparatus can further include a second shorting bar connected to the second side line connected to the plurality of low potential power lines and insulated from the first shorting bar. The first shorting bar can be connected to the first side line connected to the high potential power line, and the first shorting bar and the second shorting bar can extend in a direction intersecting an extension direction of the plurality of first side lines.

The first shorting bar and the second shorting bar may not overlap each other.

The first shorting bar can include a plurality of parts spaced apart from each other, and each of the plurality of parts of the first shorting bar can be connected to a part of the first side line connected to the high potential power line.

The second shorting bar can include a plurality of parts spaced apart from each other, and each of the plurality of parts of the second shorting bar can be connected to a part of the first second side line connected to the low potential power line.

The display apparatus can further include a fourth insulating layer that covers the first side line connected to the driving line and the first side line connected to the plurality of high potential power lines. The second shorting bar can be disposed on the fourth insulating layer. The fourth insulating layer can include a first opening that exposes a part of each first side line connected to the plurality of high potential power lines, and the first opening may not overlap the first-second shorting bar.

The display apparatus can further include a fifth insulating layer that covers the fourth insulating layer and the second shorting bar. The first shorting bar can be disposed on the fifth insulating layer, and the fifth insulating layer can include a second opening at a position corresponding to the first opening.

The display apparatus can further include a sixth insulating layer that covers the fifth insulating layer and the first shorting bar. The first shorting bar can be electrically connected to the first side line connected to the plurality of high potential power lines through the first opening and the second opening.

The display apparatus can further include a seventh insulating layer that covers the second side line connected to the plurality of low potential power lines. The first shorting bar can be disposed on the seventh insulating layer, the seventh insulating layer can include a third opening that exposes a part of each second side line connected to the plurality of low potential power lines, and the third opening may not overlap the first shorting bar.

The display apparatus can further include an eighth insulating layer that covers the seventh insulating layer and the first shorting bar. The second shorting bar can be disposed on the eighth insulating layer, and the eighth insulating layer can include a fourth opening at a position corresponding to the third opening.

The display apparatus can further include a ninth insulating layer that covers the eighth insulating layer and the second shorting bar. The second shorting bar can be electrically connected to the second side line connected to the plurality of low potential power lines through the third opening and the fourth opening.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. As such, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
- a substrate on which a plurality of light emitting diodes are disposed;
- a plurality of first upper lines disposed at one side on a top surface of the substrate;
- a plurality of first lower lines disposed at one side on a rear surface of the substrate;
- a plurality of first side lines disposed on a side surface of the substrate and electrically connected to the plurality of first upper lines and the plurality of first lower lines; and
- a first shorting bar disposed on the side surface of the substrate, overlapping at least some of the plurality of first side lines in a direction parallel to the top surface of the substrate, and electrically connecting the at least some of the plurality of first side lines.

2. The display device according to claim 1, further comprising:
- a plurality of second upper lines disposed at another side on the top surface of the substrate;
- a plurality of second lower lines disposed at another side on the rear surface of the substrate;
- a plurality of second side lines disposed on another side surface of the substrate and electrically connected to the plurality of second upper lines and the plurality of second lower lines; and
- a second shorting bar disposed on the another side surface of the substrate and electrically connecting at least some of the plurality of second side lines.

3. The display device according to claim 2, wherein the plurality of first upper lines includes a plurality of high potential power lines and a plurality of driving lines, and
- the plurality of second upper lines includes a plurality of low potential power lines, and
- the plurality of driving lines includes at least one or some of a plurality of gate lines, a plurality of data lines, a plurality of reference voltage lines, and a plurality of emission signal lines.

4. The display device according to claim 3, further comprising:
- a first insulating layer covering the plurality of second side lines and the second shorting bar.

5. The display device according to claim 3, wherein the second shorting bar is connected to all of the plurality of second side lines.

6. The display device according to claim 3, wherein the second shorting bar includes a plurality of parts spaced apart from each other, and
- each of the plurality of parts of the second shorting bar is connected to some of the plurality of second side lines.

7. The display device according to claim 3, wherein the first shorting bar is connected to all the first side lines connected to the plurality of high potential power lines among the plurality of first side lines.

8. The display device according to claim 3, wherein the first shorting bar includes a plurality of parts spaced apart from each other, and each of the plurality of parts of the first shorting bar is connected to a part of the first side line connected to the plurality of high potential power lines among the plurality of first side lines.

9. The display device according to claim 3, further comprising:

a second insulating layer covering the first side lines connected to the plurality of driving lines among the plurality of first side lines, wherein the first shorting bar is disposed on the second insulating layer.

10. The display device according to claim 9, further comprising:

a third insulating layer covering the second insulating layer and the first shorting bar.

11. The display device according to claim 1, wherein the plurality of first upper lines includes a plurality of low potential power lines, a plurality of high potential power lines, and a plurality of driving lines, and the plurality of driving lines includes at least one or some of a plurality of gate lines, a plurality of data lines, a plurality of reference voltage lines, and a plurality of emission signal lines.

12. The display device according to claim 11, further comprising:

a second shorting bar connected to a plurality of second side lines connected to the plurality of low potential power lines and insulated from the first shorting bar, wherein the first shorting bar is connected to the plurality of first side lines connected to the high potential power line, and the first shorting bar and the second shorting bar extend in a direction intersecting an extension direction of the plurality of first side lines.

13. The display device according to claim 12, wherein the first shorting bar and the second shorting bar do not overlap each other.

14. The display device according to claim 12, wherein the first shorting bar includes a plurality of parts spaced apart from each other, and each of the plurality of parts of the first shorting bar is connected to a part of the plurality of first side lines connected to the high potential power line.

15. The display device according to claim 12, wherein the second shorting bar includes a plurality of parts spaced apart from each other, and each of the plurality of parts of the second shorting bar is connected to a part of the plurality of second side lines connected to the low potential power line.

16. The display device according to claim 12, further comprising:

a fourth insulating layer covering the plurality of first side lines respectively connected to the plurality of driving lines and the plurality of high potential power lines, wherein the second shorting bar is disposed on the fourth insulating layer, the fourth insulating layer includes a first opening that exposes a part of each of the plurality of first side lines connected to the plurality of high potential power lines, and the first opening does not overlap the second shorting bar.

17. The display device according to claim 16, further comprising:

a fifth insulating layer covering the fourth insulating layer and the second shorting bar, wherein the first shorting bar is disposed on the fifth insulating layer, and the fifth insulating layer includes a second opening at a position corresponding to the first opening.

18. The display device according to claim 17, further comprising:

a sixth insulating layer covering the fifth insulating layer and the first shorting bar, wherein the first shorting bar is electrically connected to the first side line connected to the plurality of high potential power lines through the first opening and the second opening.

19. The display device according to claim 12, further comprising:

a seventh insulating layer covering the plurality of second side lines respectively connected to the plurality of low potential power lines, wherein the first shorting bar is disposed on the seventh insulating layer, the seventh insulating layer includes a third opening that exposes a part of each of the plurality of second side lines connected to the plurality of low potential power lines, and the third opening does not overlap the first shorting bar.

20. The display device according to claim 19, further comprising:

an eighth insulating layer covering the seventh insulating layer and the first shorting bar, wherein the second shorting bar is disposed on the eighth insulating layer, and the eighth insulating layer includes a fourth opening at a position corresponding to the third opening.

21. The display device according to claim 20, further comprising:

a ninth insulating layer covering the eighth insulating layer and the second shorting bar, wherein the second shorting bar is electrically connected to the plurality of second side lines connected to the plurality of low potential power lines through the third opening and the fourth opening.

22. The display device according to claim 1, further comprising:

a tenth insulating layer disposed on the side surface of the substrate between at least one first side line of the plurality of first side lines and the first shorting bar.

* * * * *